(12) United States Patent
Senda et al.

(10) Patent No.: US 7,667,682 B2
(45) Date of Patent: Feb. 23, 2010

(54) DISPLAY

(75) Inventors: Michiru Senda, Gifu (JP); Hiroyuki Horibata, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 721 days.

(21) Appl. No.: 11/285,212

(22) Filed: Nov. 23, 2005

(65) Prior Publication Data
US 2006/0125766 A1   Jun. 15, 2006

(30) Foreign Application Priority Data
Nov. 25, 2004 (JP) .............................. 2004-339730
Nov. 25, 2004 (JP) .............................. 2004-339746

(51) Int. Cl.
G09G 3/34 (2006.01)
G11C 19/00 (2006.01)

(52) U.S. Cl. .............................. 345/100; 377/73; 377/74

(58) Field of Classification Search .................. 345/100; 377/73–74
See application file for complete search history.

(56) References Cited

U.S. PATENT DOCUMENTS 6,339,451 B1 * 1/2002 Tults ........................... 348/569
6,611,248 B2 * 8/2003 Kanbara et al. ............. 345/100
6,845,140 B2 * 1/2005 Moon et al. ................... 377/78
2005/0030274 A1 * 2/2005 Sano ........................... 345/100

OTHER PUBLICATIONS

Kishino et al. "The Basis of Semiconductor Devices", Apr. 25, 1985, pp. 184-187.

* cited by examiner

*Primary Examiner*—Amr Awad
*Assistant Examiner*—Jonathan Boyd
(74) *Attorney, Agent, or Firm*—McDermott Will & Emery LLP

(57) ABSTRACT

A display having a shift register circuit capable of suppressing increase of power consumption is provided. This display comprises a shift register circuit including a shift register circuit portion including a first circuit portion having a second transistor turned on in response to a first signal and a second circuit portion having a sixth transistor turned on in response to a second signal providing an ON-state period not overlapping with an ON-state period of the second transistor and an input signal switching circuit portion for switching the first and second signals supplied to the second and sixth transistors respectively.

28 Claims, 18 Drawing Sheets dry
DISPLAY

BACKGROUND OF THE INVENTION

Field of the Invention

The present invention relates to a display, and more particularly, it relates to a display having a shift register circuit.

CROSS-REFERENCE TO RELATED APPLICATIONS

The priority applications Nos. JP2004-339730 and JP2004-339746 upon which this patent application is based are hereby incorporated by reference.

DESCRIPTION OF THE BACKGROUND ART

A resistance load inverter circuit is known in general, as disclosed in "The Basis of Semiconductor Devices" by Seigo Kishino, Ohmsha Shuppan, Apr. 25, 1985, pp. 184-187, for example. Further, a shift register circuit including the aforementioned resistance load inverter circuit is also known in general. The shift register circuit is applied to a circuit driving gate lines or drain lines of a liquid crystal display or an organic EL display, for example.

FIG. 18 is a circuit diagram of conventional shift register circuits 1000a and 1000b including resistance load inverter circuits. Referring to FIG. 18, the first-stage conventional shift register circuit 1000a is constituted of a first circuit portion 1001a and a second circuit portion 1002a. The second-stage shift register circuit 1000b is constituted of a first circuit portion 1001b and a second circuit portion 1002b.

The first circuit portion 1001a constituting the first-stage shift register circuit 1000a includes n-channel transistors NT201 and NT202, a capacitor C201 and a resistor R201. In the following description of this prior art, the n-channel transistors NT201 and NT202 are referred to as transistors NT201 and NT202 respectively. The source of the transistor NT201 is connected to a node ND201, and the drain thereof receives a start signal ST. This transistor NT201 is supplied with a clock signal CLK1 in its gate. The source and the drain of the transistor NT202 are connected to a lower voltage VSS and another node ND202 respectively. First and second electrodes of the capacitor C201 are connected to the node ND201 and the lower voltage VSS respectively. First and second terminals of the resistor R201 are connected to a higher voltage VDD and the node ND202 respectively. The transistor NT202 and the resistor R201 constitute an inverter circuit.

The second circuit portion 1002a constituting the first-stage shift register circuit 1000a includes an n-channel transistor NT203 and a resistor R202. In the following description of the prior art, the n-channel transistor NT203 is referred to as a transistor NT203. The source and the drain of the transistor NT203 are connected to the lower voltage VSS and a node ND203 respectively. First and second terminals of the resistor R202 are connected to the higher voltage source VDD and the node ND203 respectively. The transistor NT203 and the resistor R202 constitute an inverter circuit.

The second-stage shift register circuit 1000b and those subsequent thereto also have circuit structures similar to that of the aforementioned first-stage shift register circuit 1000a. The first circuit portion of each shift register circuit is connected to an output node of the shift register circuit precedent thereto. The transistor NT201 of the first circuit portion arranged on each odd-stage shift register circuit is supplied with the clock signal CLK1 in its gate as described above, while the transistor NT201 of the first circuit portion arranged on each even-stage shift register circuit is supplied with another clock signal CLK2 in its gate.

FIG. 19 is a waveform diagram for illustrating operations of the conventional shift register circuits 1000a and 1000b shown in FIG. 18. The operations of the conventional shift register circuits 1000a and 1000b are now described with reference to FIGS. 18 and 19.

First, the start signal ST goes high. Thereafter the clock signal CLK1 also goes high. At this time, the transistor NT201 enters an ON-state and the voltage of the node ND201 goes up to a high level thereby turning on the transistor NT202 in the first-stage shift register circuit 1000a. Thus, the voltage of the node ND202 goes down to a low level for turning off the transistor NT203, whereby the voltage of the node ND203 goes up to a high level so that the first-stage shift register circuit 1000a outputs a high-level output signal SR1. The capacitor C201 stores a high-level voltage while the clock signal CLK1 is at the high level.

Then, the clock signal CLK1 goes low. At this time, the transistor NT201 of the first-stage shift register circuit 1000a enters an OFF-state. Thereafter the start signal ST also goes low. The first-stage shift register circuit 1000a, holding the voltage of the node ND201 at the high level through the high-level voltage stored in the capacitor C201 despite the OFF-state of the transistor NT201, holds the transistor NT202 in the ON-state. Therefore, the voltage of the node ND202 does not go up to a high level, whereby the shift register circuit 1000a holds the transistor NT203 in the OFF-state. Thus, the first-stage shift register circuit 1000a continuously outputs the high-level output signal SR1.

Then, the clock signal CLK2 goes high. Thus, the second-stage shift register circuit 1000b receives the high-level output signal SR1 from the first-stage shift register circuit 1000a, to operate similarly to the aforementioned first-stage shift register circuit 1000a. Thus, the second-stage shift register circuit 1000b outputs a high-level output signal SR2.

Thereafter the clock signal CLK1 goes high again. At this time, the transistor NT201 enters an ON-state and the voltage of the node ND201 goes down to a low level in the first-stage shift register circuit 1000a. Therefore, the transistor NT202 enters an OFF-state and the voltage of the node ND202 goes up to a high level, thereby turning on the transistor NT203. Thus, the voltage of the node ND203 goes down from the high level to a low level, whereby the first-stage shift register circuit 1000a outputs a low-level output signal SR1. The shift register circuits sequentially output timing-shifted high-level output signals (SR1, SR2, SR3 . . . ) through the aforementioned operations.

In the conventional shift register circuits 1000a and 1000b shown in FIG. 18, however, the first-stage shift register circuit 1000a holds the transistor NT202 in the ON-state when outputting the high-level output signal SR1, and hence a through current disadvantageously flows between VDD and VSS through the resistor R201 and the transistor NT202. When outputting the low-level output signal SR1, on the other hand, the shift register circuit 1000a holds the transistor NT203 in the ON-state, and hence a through current disadvantageously flows between VDD and VSS through the resistor R202 and the transistor NT203. Thus, a through current disadvantageously regularly flows between VDD and VSS. Also in the second-stage shift register circuit 1000b and those subsequent thereto, through currents disadvantageously flow between VDD and VSS due to the structures similar to that of the first-stage shift register circuit 1000a. When the aforementioned conventional shift register circuits 1000a and 1000b are applied to a circuit driving gate lines or drain lines of a liquid crystal display or an organic EL display, therefore, power consumption of the liquid crystal display or the organic EL display is disadvantageously increased.

In the conventional shift register circuits 1000a and 1000b shown in FIG. 18, high-level periods of certain output signals output from the shift-register circuits 1000a and 1000b and those of subsequent output signals overlap with each other, and hence certain gate lines and subsequent gate lines are disadvantageously driven in an overlapping manner when the shift register circuits 1000a and 1000b sequentially drive the gate lines by outputting the output signals to the gate lines of the display. In order to solve this problem, output signals from alternate shift register circuits having nonoverlapping high-level periods may conceivably be input in the gate lines. In this case, however, the number of stages of the shift register circuits must be doubled as compared with the gate lines, in order to sequentially drive the gate lines. Thus, it is disadvantageously difficult to simplify the circuit structure of the display including the shift register circuits.

SUMMARY OF THE INVENTION

The present invention has been proposed in order to solve the aforementioned problems, and an object of the present invention is to provide a display having a shift register circuit capable of suppressing increase of power consumption.

Another object of the present invention is to provide a display allowing simplification of the circuit structure thereof.

In order to attain the aforementioned objects, a display according to a first aspect of the present invention comprises a shift register circuit including a shift register circuit portion including a first circuit portion having a first transistor connected to a first voltage and a second transistor connected to a clock signal line and turned on in response to a first signal and a second circuit portion having a third transistor turned on in response to a clock signal, a fourth transistor connected to the first voltage, a fifth transistor connected between the gate of the third transistor and the first voltage and a sixth transistor connected between the gate of the third transistor and the clock signal line and turned on in response to a second signal providing an ON-state period not overlapping with an ON-state period of the second transistor receiving the first signal thereby supplying the clock signal to the gate of the third transistor, a scanning direction switching circuit portion for switching a scanning direction and an input signal switching circuit portion for switching the first signal and the second signal supplied to the gate of the second transistor and the gate of the sixth transistor respectively in response to the scanning direction.

The display according to the first aspect, provided with the second transistor turned on in response to the first signal and the sixth transistor turned on in response to the second signal providing the ON-state period not overlapping with the ON-state period of the second transistor receiving the first signal thereby supplying the clock signal to the gate of the third transistor as hereinabove described, can inhibit a through current from flowing between the first voltage and the clock signal line through the fifth and sixth transistors since the fifth transistor and the sixth transistor turned on in response to the second signal do not enter ON-states at the same time if the display also turns on the fifth transistor when turning on the second transistor in response to the first signal, for example. In this case, the display can inhibit a through current from flowing through the third and fourth transistors since the third transistor supplied with the clock signal in its gate through the sixth transistor turned on in response to the second signal and the fourth transistor do not enter ON-states at the same time if the display also turns on the fourth transistor when turning on the fifth transistor. Further, the display can inhibit a through current from flowing between the first voltage and the clock signal line through the first and second transistors since the first and second transistors do not enter ON-states at the same time if the display turns off the first transistor when turning on the second transistor in response to the first signal. Thus, the display including the shift register circuit portion, capable of inhibiting generation of through currents in the shift register circuit portion, can suppress increase of power consumption. In addition, the display provided with the input signal switching circuit portion for switching the first and second signals supplied to the second and sixth transistors respectively in response to the scanning direction can control the second and sixth transistors to be turned on in response to the first and second signals respectively also when switching the scanning direction. Thus, the display can suppress generation of through currents in the shift register circuit portion similarly to the above by turning off the first transistor while turning on the fourth and fifth transistors when turning on the second transistor similarly to the above, also when switching the scanning direction. Consequently, the display having a bidirectional scanning function can suppress increase of power consumption.

A display according to a second aspect of the present invention comprises a shift register circuit including a first shift register circuit portion constituted of a first conductive type transistor for outputting a first shift signal, a second shift register circuit portion constituted of a first conductive type transistor for outputting a second shift signal and arranged subsequently to the first shift register circuit portion and a logic composition circuit portion outputting a shift output signal by logically compositing the first shift signal and the second shift signal with each other.

According to the second aspect, the display having the shift register circuit including the first shift register circuit portion outputting the first shift signal, the second shift register circuit portion, outputting the second shift signal, arranged subsequently to the first shift register circuit portion and the logic composition circuit portion outputting the shift output signal by logically compositing the first and second shift signals with each other as hereinabove described can output a prescribed shift output signal from the logic composition circuit portion of the shift register circuit through the first and second shift signals from the first shift register circuit portion and the subsequent second shift register circuit portion and output a subsequent shift output signal not overlapping in timing with the aforementioned prescribed shift output signal from the logic composition circuit portion of the shift register circuit through the second shift signal from the second shift register circuit portion and a shift signal from a shift register circuit subsequent to the second shift register circuit portion. Thus, the display can share a single-stage shift register circuit portion between the two stages of shift register circuit portions employed for outputting the prescribed shift output signal and the two stages of shift register circuit portions employed for outputting the subsequent shift output signal not overlapping in timing with the prescribed output signal. Therefore, the display including the shift register circuit, capable of reducing the number of the shift register circuit portions constituting the shift register circuit, can be simplified in circuit structure. Further, both of the first and second shift register circuit portions are constituted of first conductive type transistors, whereby the numbers of ion implantation steps and ion implantation masks can be reduced when forming the first and second shift register circuit portions as compared with a case of constituting the first and second shift register circuit portions of two types of transistors, i.e. first and second conductive type transistors respectively. Thus, the manufacturing process can be inhibited from complication, and the manufacturing cost can be inhibited from increase.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
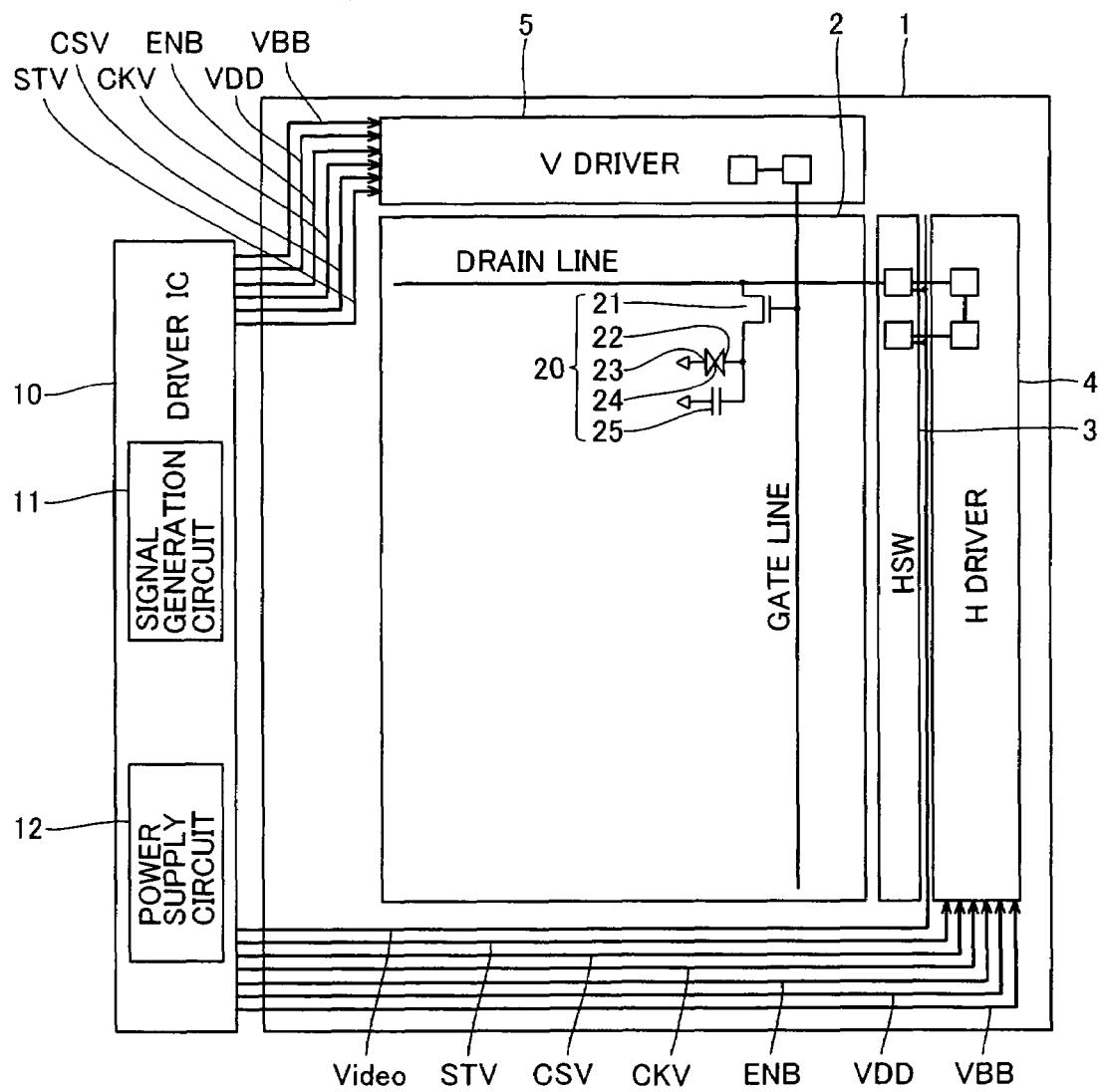
FIG. 1 is a plan view showing a liquid crystal display according to a first embodiment of the present invention.

Referring to FIG. 1, a display portion 2 is provided on a substrate 1 in a liquid crystal display according to a first embodiment of the present invention. On this display portion 2, pixels 20 are arranged in the form of a matrix. FIG. 1 shows only one pixel 20, in order to simplify the illustration. Each pixel 20 is constituted of an n-channel transistor 21 (hereinafter referred to as a transistor 21), a pixel electrode 22, a common electrode 23, common to the respective pixels 20, opposed to the pixel electrode 22, a liquid crystal 24 held between the pixel electrode 22 and the common electrode 23 and a subsidiary capacitor 25. The source of the transistor 21 is connected to the pixel electrode 22 and the subsidiary capacitor 25, and the drain thereof is connected to a drain line. The gate of this transistor 21 is connected to a gate line.

Horizontal switches (HSW) 3 and an H driver 4 for driving (scanning) drain lines of the display portion 2 are provided on the substrate 1 along one edge of the display portion 2. A V driver 5 for driving (scanning) gate lines of the display portion 2 is provided along another edge of the display portion 2. While FIG. 1 illustrates only two horizontal switches 3, the horizontal switches 3 are arranged in a number responsive to the pixel number in practice. While each of the H and V drivers 4 and 5 shown in FIG. 1 has only two shift register circuit portions, the shift register circuit portions are arranged in a number responsive to the pixel number in practice.

A driver IC 10 is set outside the substrate 1. This driver IC 10 comprises a signal generation circuit 11 and a power supply circuit 12. The driver IC 10 supplies the H driver 4 with a video signal Video, a start signal STV, a scanning direction switching signal CSV, a clock signal CKV, an enable signal ENB, a higher voltage VDD and a lower voltage VBB. The driver IC 10 also supplies the V driver 5 with the start signal STV, the scanning direction switching signal CSV, the clock signal CKV, the enable signal ENB, the higher voltage VDD and the lower voltage VBB.

Figure 2:
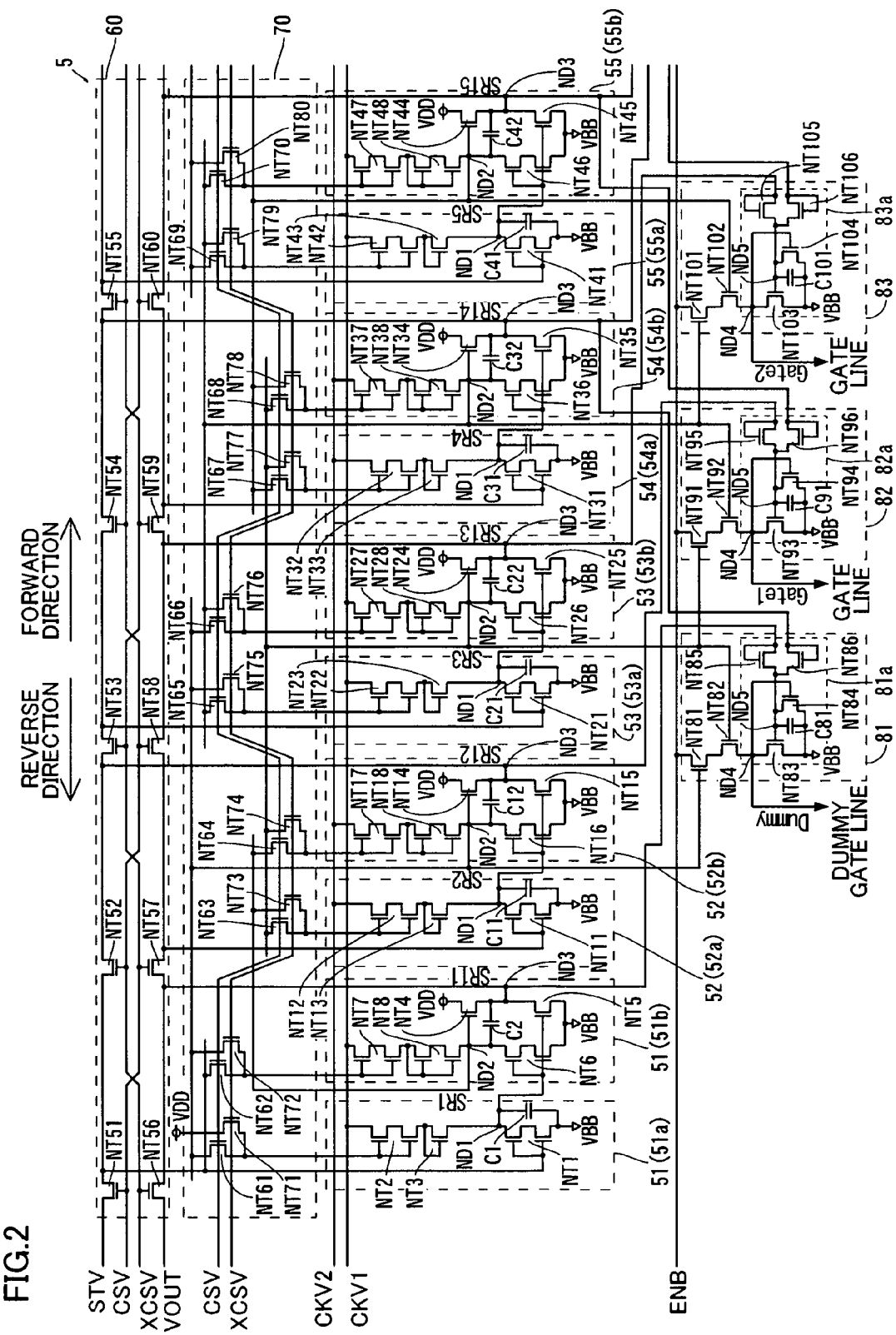
FIG. 2 is a circuit diagram inside a V driver of the liquid crystal display according to the first embodiment shown in FIG. 1.

Referring to FIG. 2, the V driver 5 is provided therein with a plurality of stages of shift register circuit portions 51 to 55, a scanning direction switching circuit portion 60, an input signal switching circuit portion 70 and a plurality of stages of logic composition circuit portions 81 to 83 according to the first embodiment. While FIG. 2 shows only five stages of shift register circuit portions 51 to 55 and three stages of logic composition circuit portions 81 to 83 in order to simplify the illustration, the shift register circuit portions and the logic composition circuit portions are provided in numbers responsive to the pixel number respectively in practice.

The first-stage shift register circuit portion 51 is constituted of a first circuit portion 51a and a second circuit portion 51b. The first circuit portion 51a includes n-channel transistors NT1 and NT2, a diode-connected n-channel transistor NT3 and a capacitor C1. The second circuit portion 51b includes n-channel transistors NT4, NT5, NT6 and NT7, a diode-connected n-channel transistor NT8 and a capacitor C2. The n-channel transistors NT1 to NT8 are hereinafter referred to as transistors NT1 to NT8 respectively.

According to the first embodiment, all of the transistors NT1 to NT8 provided on the first-stage shift register circuit portion 51 are constituted of TFTs (thin-film transistors) formed by n-type MOS transistors (field-effect transistors).

According to the first embodiment, each of the transistors NT1, NT2, NT6, NT7 and NT8 has two gate electrodes electrically connected with each other.

In the first circuit portion 51a, the source and the drain of the transistor NT1 are connected to the lower voltage VBB and a node ND1 respectively. First and second electrodes of the capacitor C1 are connected to the lower voltage VBB and the node ND1 respectively.

According to the first embodiment, the source of the transistor NT2 is connected to the node ND1 through the transistor NT3, and the drain thereof is connected to a clock signal line (CKV1).

In the second circuit portion 51b, the source and the drain of the transistor NT4 are connected to a node ND3 and the higher voltage VDD respectively. The gate of this transistor NT4 is connected to a node ND2. The source and the drain of the transistor NT5 are connected to the lower voltage VBB and the node ND3 respectively. The gate of this transistor NT5 is connected to the node ND1 of the first circuit portion 51a. The source and the drain of the transistor NT6 are connected to the lower voltage VBB and the node ND2 respectively. The gate of this transistor NT6 is connected to the node ND1 of the first circuit portion 51a.

According to the first embodiment, the transistor NT6 is provided for turning off the transistor NT4 when the transistor NT5 is in an ON-state. According to the first embodiment, further, the source of the transistor NT7 is connected to the node ND2 through the transistor NT8, and the drain thereof is connected to the clock signal line (CKV1). According to the first embodiment, the capacitor C2 is connected between the gate and the source of the transistor NT4.

The second- to fifth-stage shift register circuit portions 52 to 55 have circuit structures similar to that of the aforementioned first-stage shift register circuit portion 51. More specifically, the second- to fifth-stage shift register circuit portions 52 to 55 are constituted of first circuit portions 52a to 55a and second circuit portions 52b to 55b having circuit structures similar to those of the first and second circuit portions 51a and 51b of the first-stage shift register circuit portion 51 respectively.

The second-stage shift register circuit portion 52 includes n-channel transistors NT11 to NT18 and capacitors C11 and C12 corresponding to the transistors NT1 to NT8 and the capacitors C1 and C2 of the first-stage shift register circuit portion 51 respectively. The n-channel transistors NT11 to NT18 are hereinafter referred to as transistors NT11 to NT18 respectively.

The third-stage shift register circuit portion 53 includes n-channel transistors NT21 to NT28 and capacitors C21 and C22 corresponding to the transistors NT1 to NT8 and the capacitors C1 and C2 of the first-stage shift register circuit portion 51 respectively. The n-channel transistors NT21 to NT28 are hereinafter referred to as transistors NT21 to NT28 respectively.

The fourth-stage shift register circuit portion 54 includes n-channel transistors NT31 to NT38 and capacitors C31 and C32 corresponding to the transistors NT1 to NT8 and the capacitors C1 and C2 of the first-stage shift register circuit portion 51 respectively. The n-channel transistors NT31 to NT38 are hereinafter referred to as transistors NT31 to NT38 respectively.

The fifth-stage shift register circuit portion 55 includes n-channel transistors NT41 to NT48 and capacitors C41 and C42 corresponding to the transistors NT1 to NT8 and the capacitors C1 and C2 of the first-stage shift register circuit portion 51 respectively. The n-channel transistors NT41 to NT48 are hereinafter referred to as transistors NT41 to NT48 respectively.

The transistors NT12, NT17, NT32 and NT37 of the second- and fourth-stage shift register circuit portions 52 and 54 are connected to a clock signal line (CKV2). The transistors NT22, NT27, NT42 and NT47 of the third- and fifth-stage shift register circuit portions 53 and 55 are connected to the clock signal line (CKV1). In other words, the clock signal lines (CKV1 and CKV2) are alternately connected to the shift register circuit portions 51 to 55.

The scanning direction switching circuit portion 60 includes n-channel transistors NT51 to NT60. The n-channel transistors NT51 to NT60 are hereinafter referred to as transistors NT51 to NT60 respectively.

According to the first embodiment, all of the transistors NT51 to NT60 constituting the scanning direction switching circuit portion 60 are constituted of TFTs formed by n-type MOS transistors.

Either the sources or the drains and either the drains or the sources of the transistors NT51 to NT55 are connected with each other in this order. A scanning direction switching signal line (CSV) is connected to the gates of the transistors NT51, NT53 and NT55, while an inverted scanning direction switching signal line (XCSV) is connected to the gates of the transistors NT52 and NT54. In other words, the scanning direction switching signal line (CSV) and the inverted scanning direction switching signal line (XCSV) are alternately connected to the gates of the transistors NT51 to NT55.

Either the sources or the drains and either the drains or the sources of the transistors NT56 to NT60 are connected with each other in this order. The inverted scanning direction switching signal line (XCSV) is connected to the gates of the transistors NT56, NT58 and NT60, while the scanning direction switching signal line (CSV) is connected to the gates of the transistors NT57 and NT59. In other words, the inverted scanning direction switching signal line (XCSV) and the scanning direction switching signal line (CSV) are alternately connected to the gates of the transistors NT56 to NT60.

When the scanning direction is forward, the liquid crystal display controls the scanning direction switching signal line (CSV) and the inverted scanning direction switching signal lines (XCSV) to go high (VDD) and low (VBB) respectively. When the scanning direction is forward, therefore, the liquid crystal display controls the transistors NT51, NT53, NT55, NT57 and NT59 to enter ON-states while controlling the transistors NT52, NT54, NT56, NT58 and NT60 to enter OFF-states. When the scanning direction is reverse, on the other hand, the liquid crystal display controls the scanning direction switching signal line (CSV) and the inverted scanning direction switching signal line (XCSV) to go low (VBB) and high (VDD) respectively. When the scanning direction is reverse, therefore, the liquid crystal display controls the transistors NT51, NT53, NT55, NT57 and NT59 to enter OFF-states while controlling the transistors NT52, NT54, NT56, NT58 and NT60 to enter ON-states.

The gate of the transistor NT1 of the first-stage shift register circuit portion 51 is connected to either the drain or the source of the transistor NT51 (either the source or the drain of the transistor NT52) of the scanning direction switching circuit portion 60, while the node ND3 of the first-stage shift register circuit portion 51 is connected to either the drain or the source of the transistor NT56 (either the source or the drain of the transistor NT57) of the scanning direction switching circuit portion 60.

The gate of the transistor NT11 of the second-stage shift register circuit portion 52 is connected to either the drain or the source of the transistor NT57 (either the source or the drain of the transistor NT58) of the scanning direction switching circuit portion 60, while the node ND3 of the second-stage shift register circuit portion 52 is connected to either the drain or the source of the transistor NT52 (either the source or the drain of the transistor NT53) of the scanning direction switching circuit portion 60.

The gate of the transistor NT21 of the third-stage shift register circuit portion 53 is connected to either the drain or the source of the transistor NT53 (either the source or the drain of the transistor NT54) of the scanning direction switching circuit portion 60, while the node ND3 of the third-stage shift register circuit portion 53 is connected to either the drain or the source of the transistor NT58 (either the source or the drain of the transistor NT59) of the scanning direction switching circuit portion 60.

The gate of the transistor NT31 of the fourth-stage shift register circuit portion 54 is connected to either the drain or the source of the transistor NT59 (either the source or the drain of the transistor NT60) of the scanning direction switching circuit portion 60, while the node ND3 of the fourth-stage shift register circuit portion 54 is connected to either the drain or the source of the transistor NT54 (either the source or the drain of the transistor NT55) of the scanning direction switching circuit portion 60.

The gate of the transistor NT41 of the fifth-stage shift register circuit portion 55 is connected to either the drain or the source of the transistor NT55 of the scanning direction switching circuit portion 60, while the node ND3 of the fifth-stage shift register circuit portion 55 is connected to either the drain or the source of the transistor NT60 of the scanning direction switching circuit portion 60.

The shift register circuit portions 51 to 55 and the scanning direction switching circuit portion 60 are connected with each other in the aforementioned manner, so that the liquid crystal display controls the shift output signals (SR11 to SR15) precedent relative to the scanning direction to be input in the first circuit portions of the shift register circuit portions respectively in response to the scanning direction. However, the liquid crystal display inputs the start signal STV in the first circuit portion 51a of the first-stage shift register circuit portion 51.

The input signal switching circuit portion 70 includes n-channel transistors NT61 to NT80. The n-channel transistors NT61 to NT80 are hereinafter referred to as transistors NT61 to NT80 respectively.

According to the first embodiment, all of the transistors NT61 to NT80 constituting the input signal switching circuit portion 70 is constituted of TFTs formed by n-type MOS transistors.

According to the first embodiment, pairs of n-channel transistors having gates connected to the corresponding scanning direction switching signal line (CSV) and the corresponding inverted scanning direction switching signal line (XCSV) respectively are provided every stage. More specifically, the transistors NT61 and NT62 whose gates are connected to another scanning direction switching signal line (CSV) and the transistors NT71 and NT72 whose gates are connected to another inverted scanning direction switching signal line (XCSV) are provided on the first stage. Either the sources or the drains of the transistors NT61 and NT71 are connected to the gate of the transistor NT2 of the first-stage shift register circuit portion 51. Either the drains or the sources of the transistors NT61 and NT71 are connected to the node ND2 of the second-stage shift register circuit portion 52 and the higher voltage VDD respectively. Either the sources or the drains of the transistors NT62 and NT72 are connected to the gate of the transistor NT7 of the first-stage shift register circuit portion 51. Either the drain or the source of the transistor NT62 is connected to either the drain or the source of the transistor NT51 (either the source or the drain of the transistor NT52) of the scanning direction switching circuit portion 60 supplied with the start signal STV and the gate of the transistor NT1, while either the drain or the source of the transistor NT72 is connected to the node ND2 of the second-stage shift register circuit portion 52.

The transistors NT63 and NT64 whose gates are connected to the scanning direction switching signal line (CSV) and the transistors NT73 and NT74 whose gates are connected to the inverted scanning direction signal switching signal line (XCSV) are provided on the second stage. Either the sources or the drains of the transistors NT63 and NT73 are connected to the gate of the transistor NT12 of the second-stage shift register circuit portion 52. Either the drains or the sources of the transistors NT63 and NT73 are connected to the nodes ND2 of the third- and first-stage shift register circuit portions 53 and 51 respectively. Either the sources or the drains of the transistors NT64 and NT74 are connected to the gate of the transistor NT17 of the second-stage shift register circuit portion 52. Either the drains or the sources of the transistors NT64 and NT74 are connected to the nodes ND2 of the first- and third-stage shift register circuit portions 51 and 53 respectively.

The transistors NT65 and NT66 whose gates are connected to the scanning direction switching signal line (CSV) and the transistors NT75 and NT76 whose gates are connected to the inverted scanning direction switching signal line (XCSV) are provided on the third stage. Either the sources or the drains of the transistors NT65 and NT75 are connected to the gate of the transistor NT22 of the third-stage shift register circuit portion 53. Either the drains or the sources of the transistors NT65 and NT75 are connected to the nodes ND2 of the fourth- and second-stage shift register circuit portions 54 and 52 respectively. Either the sources or the drains of the transistors NT66 and NT76 are connected to the gate of the transistor NT27 of the third-stage shift register circuit portion 53. Either the drains or the sources of the transistors NT66 and NT76 are connected to the nodes ND2 of the second- and fourth-stage shift register circuit portions 52 and 54 respectively.

The transistors NT67 and NT68 whose gates are connected to the scanning direction switching signal line (CSV) and the transistors NT77 and NT78 whose gates are connected to the inverted scanning direction switching signal line (XCSV) are provided on the fourth stage. Either the sources or the drains of the transistors NT67 and NT77 are connected to the gate of the transistor NT32 of the fourth-stage shift register circuit portion 54. Either the drains or the sources of the transistors NT67 and NT77 are connected to the nodes ND2 of the fifth- and third-stage shift register circuit portions 55 and 53 respectively. Either the sources or the drains of the transistors NT68 and NT78 are connected to the gate of the transistor NT37 of the fourth-stage shift register circuit portion 54. Either the drains or the sources of the transistors NT68 and NT78 are connected to the nodes ND2 of the third- and fifth-stage shift register circuit portions 53 and 55 respectively.

The transistors NT69 and NT70 whose gates are connected to the scanning direction switching signal line (CSV) and the transistors NT79 and NT80 whose gates are connected to the inverted scanning direction switching signal line (XCSV) are provided on the fifth stage. Either the sources or the drains of the transistors NT69 and NT79 are connected to the gate of the transistor NT42 of the fifth-stage shift register circuit portion 55. Either the drain or the source of the transistor NT69 is connected to a node ND2 of a sixth-stage shift register circuit portion (not shown), while either the drain or the source of the transistor NT79 is connected to the node ND2 of the fourth-stage shift register circuit portion 54. Either the sources or the drains of the transistors NT70 and NT80 are connected to the gate of the transistor NT47 of the fifth-stage shift register circuit portion 55. Either the drains or the sources of the transistors NT70 and NT80 are connected to the nodes ND2 of the fourth-stage shift register circuit portion 54 and the sixth-stage shift register circuit portion (not shown) respectively.

The transistors NT61 to NT80 constituting the input signal switching circuit portion 70 are structured in the aforementioned manner so that the liquid crystal display controls the transistors NT61 to NT70 and NT71 to NT80 to enter ON- and OFF-states respectively when the scanning direction is forward. The shift register circuit portions 51 to 55 and the input signal switching circuit portion 70 are connected in the aforementioned manner so that the liquid crystal display controls the shift signals (SR1 to SR5) subsequent and precedent relative to the scanning direction to be input in the first and second circuit portions of the shift register circuit portions located therebetween respectively. However, the liquid crystal display inputs the start signal STV in the first circuit portion 51a of the first-stage shift register circuit portion 51.

The logic composition circuit portions 81 to 83 are connected to a dummy gate line (Dummy), a first-stage gate line (Gate1) and a second-stage gate line (Gate2) respectively. The logic composition circuit portions 81 to 83 logically composite the shift signals output from the corresponding shift register circuit portions and those output from the subsequent shift register circuit portions with each other to output the shift output signals to the corresponding gate lines (Dummy, Gate1 and Gate2) respectively.

The logic composition circuit portion 81 connected to the dummy gate line (Dummy) includes n-channel transistors NT81 to NT84, diode-connected n-channel transistors NT85 and NT86 and a capacitor C81. The n-channel transistors NT81 to NT86 are hereinafter referred to as transistors NT81 to NT86 respectively. The transistors NT83 to NT86 and the capacitor C81 constitute a voltage fixing circuit portion 81a. This voltage fixing circuit portion 81a is provided for fixing the low-level voltage of a low-level shift output signal output from the logic composition circuit portion 81 to the dummy gate line (Dummy).

According to the first embodiment, all of the transistors NT81 to NT86 constituting the logic composition circuit portion 81 are constituted of TFTs formed by n-type MOS transistors.

The drain and the source of the transistor NT81 are connected to an enable signal line (ENB) and the drain of the transistor NT82 respectively. The source of the transistor NT82 is connected to a node ND4 (dummy gate line). The gates of the transistors NT81 and NT82 are connected to the nodes ND2 of the second- and third-stage shift register circuit portions 52 and 53 outputting the shift signals SR2 and SR3 respectively.

The source and the drain of the transistor NT83 are connected to the lower voltage VBB and the node ND4 (dummy gate line) respectively. The gate of this transistor NT83 is connected to a node ND5. The source and the drain of the transistor NT84 are connected to the lower voltage VBB and the node ND5 respectively. The gate of this transistor NT84 is connected to the node ND4 (dummy gate line). First and second electrodes of the capacitor C81 are connected to the lower voltage VBB and the node ND5 respectively. The node ND5 is connected to the nodes ND3 of the first- and fourth-shift register circuit portions 51 and 54 outputting the shift output signals SR11 and SR14 through the transistors NT85 and NT86 respectively.

The logic composition circuit portion 82 connected to the first-stage gate line (Gate1) has a circuit structure similar to that of the logic composition circuit portion 81 connected to the dummy gate line (Dummy). More specifically, the logic composition circuit portion 82 connected to the first-stage gate line (Gate1) includes n-channel transistors NT91 to NT96 and a capacitor C91 corresponding to the transistors NT81 to NT86 and the capacitor C81 of the logic composition circuit portion 81 connected to the dummy gate line (Dummy) respectively. The n-channel transistors NT91 to NT96 are hereinafter referred to as transistors NT91 to NT96 respectively. The transistors NT93 to NT96 and the capacitor C91 constitute a voltage fixing circuit portion 82a corresponding to the voltage fixing circuit portion 81a of the logic composition circuit portion 81 connected to the dummy gate line (Dummy).

In the logic composition circuit portion 82 connected to the first-stage gate line (Gate1), the gates of the transistors NT91 and NT92 are connected to the nodes ND2 of the third- and fourth-stage shift register circuit portions 53 and 54 outputting the shift signals SR3 and SR4 respectively. A node ND5 is connected to the nodes ND3 of the second- and fifth-stage shift register circuit portions 52 and 55 outputting the shift output signals SR12 and SR15 through the transistors NT95 and NT96 respectively.

The logic composition circuit portion 83 connected to the second-stage gate line (Gate2) has a circuit structure similar to that of the logic composition circuit portion 81 connected to the dummy gate line (Dummy). More specifically, the logic composition circuit portion 83 connected to the second-stage gate line (Gate2) includes n-channel transistors NT101 to NT106 and a capacitor C101 corresponding to the transistors NT81 to NT86 and the capacitor C81 of the logic composition circuit portion 81 connected to the dummy gate line (Dummy) respectively. The n-channel transistors NT101 to NT106 are hereinafter referred to as transistors NT101 to NT106 respectively. The transistors NT103 to NT106 and the capacitor C101 constitute a voltage fixing circuit portion 83a corresponding to the voltage fixing circuit portion 81a of the logic composition circuit portion 81 connected to the dummy gate line (Dummy).

In the logic composition circuit portion 83 connected to the second-stage gate line (Gate2), the gates of the transistors NT101 and NT102 are connected to the nodes ND2 of the fourth- and fifth-stage shift register circuit portions 54 and 55 outputting the shift signals SR4 and SR5 respectively. A node ND5 is connected to the node ND3 of the third-stage shift register circuit portion 53 outputting the shift output signal SR13 through the transistor NT105 and to the node ND3 of the sixth-stage shift register circuit portion (not shown) outputting the shift output signal through the transistor NT106.

Figure 3:
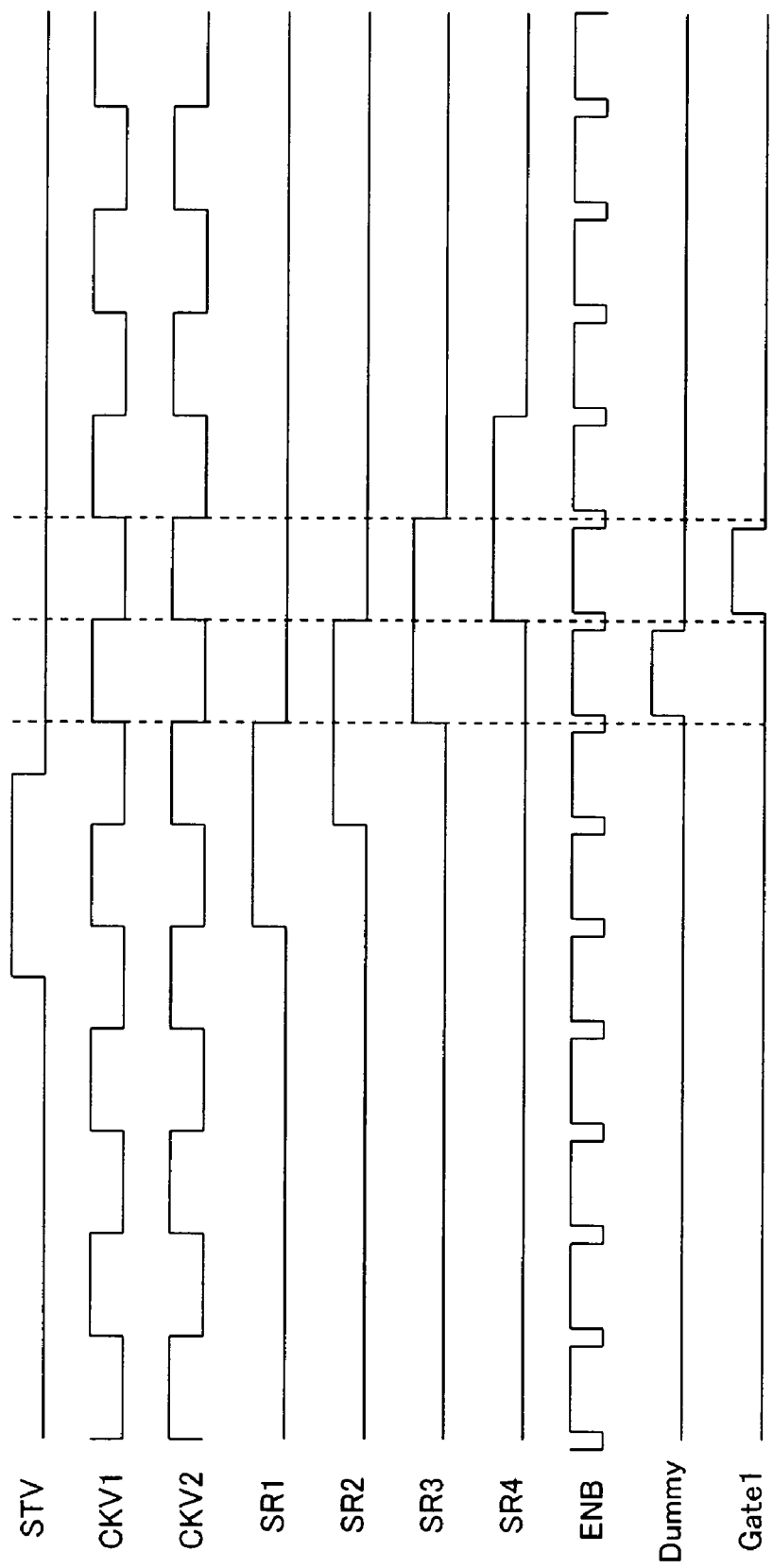
FIG. 3 is a voltage waveform diagram for illustrating operations of the V driver of the liquid crystal display according to the first embodiment of the present invention.

Operations of the V driver 5 of the liquid crystal display according to the first embodiment are now described with reference to FIGS. 2 and 3.

First, the liquid crystal display sequentially outputs timing-shifted output signals to the respective gate lines along the forward direction in FIG. 2 (forward scanning). In the case of forward scanning, the liquid crystal display holds the scanning direction switching signal CSV and the inverted scanning direction switching signal XCSV at high and low levels respectively. Thus, the liquid crystal display holds the transistors NT51, NT53, NT55, NT57 and NT59 receiving the scanning direction switching signal CVS in the gates thereof in ON-states while holding the transistors NT52, NT54, NT456, NT58 and NT60 receiving the inverted scanning direction switching signal XCSV in the gates thereof in OFF-states in the scanning direction switching circuit portion 60. In the input signal switching circuit portion 70, the liquid crystal display holds the transistors NT61 to NT70 receiving the scanning direction switching signal CSV in the gates thereof in ON-states, while holding the transistors NT71 to NT80 receiving the inverted scanning direction switching signal XCSV in the gates thereof in OFF-states. In the initial state, the shift signals SR1 to SR5 and the shift output signals SR11 to SR15 output from the nodes ND2 and ND3 of the shift register circuit portions 51 to 55 respectively are at low levels. Further, output signals Dummy, Gate1 and Gate2 output from the nodes ND4 of the logic composition circuit portions 81 to 83 to the dummy gate line (Dummy) and the gate lines (Gate1 and Gate2) respectively are also at low levels. In this state, the liquid crystal display raises the start signal STV to a high level as shown in FIG. 3. Thus, the liquid crystal display inputs a high-level start signal STV in the gate of the transistor NT1 of the first-stage shift register circuit portion 51 through the ON-state transistor NT51 of the scanning direction switching circuit portion 60, thereby turning on the transistor NT1. Thereafter the clock signal CKV1 input in the drains of the transistors NT2 and NT7 of the first-stage shift register circuit portion 51 goes up to a high level (VDD).

According to the first embodiment, the transistor NT2 of the first-stage shift register circuit portion 51 receives a low-level shift signal SR2 output from the second-stage shift register circuit portion 52 in its gate through the ON-state transistor NT61 of the input signal switching circuit portion 70 at this time. Thus, the transistor NT2 is in an OFF-state. Therefore, no through current flows between the clock signal line (CKV1) and the lower voltage VBB through the transistors NT1 and NT2, despite the ON-state of the transistor NT1.

The voltage of the node ND1 supplied with a low-level voltage from the lower voltage VBB through the transistor NT1 goes down to a low level due to the ON- and OFF-states of the transistors NT1 and NT2 of the first-stage shift register circuit portion 51. Thus, the transistors NT5 and NT6 whose gates are connected to the node ND1 of the first-stage shift register circuit portion 51 enter OFF-states.

The liquid crystal display inputs the high-level start signal STV also in the gate of the transistor NT7 of the first-stage shift register circuit portion 51 through the ON-state transistors NT51 and NT62 of the scanning direction switching circuit portion 60 and the input signal switching circuit portion 70. Thus, the transistor NT7 is in an ON-state.

At this time, no through current flows between the clock signal line (CKV1) and the lower voltage VBB through the transistors NT6 and NT7 due to the OFF-state of the transistor NT6, despite the ON-state of the transistor NT7.

The voltage of the node ND2 of the first-stage shift register circuit portion 51 goes up to a high level due to the high-level clock signal CKV1 received through the transistors NT7 and NT8. Thus, the transistor NT4 enters an ON-state, while the liquid crystal display supplies a high-level voltage (VDD) to the node ND3 from the higher voltage VDD through the transistor NT4.

According to the first embodiment, no through current flows between the higher and lower voltages VDD and VBB through the transistors NT4 and NT5 at this time due to the OFF-state of the transistor NT5, despite the ON-state of the transistor NT4.

The voltage of the node ND3 goes up to VDD due to the high-level voltage (VDD) supplied from the higher voltage VDD through the transistor NT4. At this time, the liquid crystal display boots and raises the voltage of the node ND2 of the first-stage shift register circuit portion 51 following rise of the voltage of the node ND3, in order to maintain the gate-to-source voltage of the transistor NT4 through the capacitor C2. Thus, the voltage of the node ND2 goes up to a level higher than VDD by a prescribed voltage (Vα) exceeding the threshold voltage (Vt). Therefore, the first-stage shift register circuit 51 outputs a high-level shift signal SR1 having a voltage (VDD+Vα) exceeding VDD+Vt from the node ND2. At the same time, the first-stage shift register circuit portion 51 outputs a high-level shift output signal SR11 (VDD) from the node ND3.

The transistor NT83 receives the high-level shift output signal SR11 (VDD) from the first-stage shift register circuit portion 51 through the transistor NT85 of the logic composition circuit portion 81 linked with the dummy gate line (Dummy). At this time, the transistors NT81 and NT82 of the logic composition circuit portion 81 receive low-level shift signals SR2 and SR3 from the second- and third-stage shift register circuit portions 52 and 53 in the gates thereof respectively. Thus, both of the transistors NT81 an IT82 of the logic composition circuit portion 81 are in OFF-states. Therefore, the logic composition circuit portion 81 continuously outputs a low-level output signal Dummy (VBB) to the dummy gate line (Dummy) due to the low-level voltage (VBB) supplied from the lower voltage VBB through the transistor NT83.

Also the transistor NT11 of the second-stage shift register circuit portion 52 receives the high-level shift output signal SR11 (VDD) from the first-stage shift register circuit portion 51 in its gate through the ON-state transistor NT57 of the scanning direction switching circuit portion 60. Thus, the transistor NT11 enters an ON-state. The transistor NT17 of the second-stage shift register circuit portion 52 receives the high-level shift signal SR1 (VDD+Vα) from the first-stage shift register circuit portion 51 in its gate through the ON-state transistor NT64 of the input signal switching circuit portion 70. Thus, the transistor NT17 enters an ON-state. The transistor NT12 of the second-stage shift register circuit portion 52 receives a low-level shift signal SR3 output from the node ND2 of the third-stage shift register circuit portion 53 in its gate. Thus, the transistor NT12 is in an OFF-state. Thereafter the voltage of a clock signal CKV2 input in the drains of the transistors NT12 and NT17 of the second-stage shift register circuit portion 52 goes up to a high level (VDD).

At this time, the shift signal SR1 is at the voltage (VDD+Vα) higher than VDD by the prescribed voltage (Vα) exceeding the threshold voltage (Vt). When inputting this shift signal SR1 in the gate of the transistor NT17 of the second-stage shift register circuit portion 52, the liquid crystal display charges the gate voltage of the transistor NT17 to VDD−Vt since the gate voltage of the transistor NT64 is equal to the voltage (VDD) of the scanning direction switching signal CSV. Thereafter the clock signal CKV2 goes up to a high level (VDD), whereby the gate voltage of the transistor NT17 further goes up by the voltage difference between VDD and VBB while holding the gate-to-source voltage. Therefore, the voltage of the node ND2 of the second-stage shift register circuit portion 52 goes up to the high level (VDD) without going down by the threshold voltage (Vt) of the transistor NT17.

Thereafter the liquid crystal display performs operations similar to that on the aforementioned first-stage shift register circuit portion 51 also on the second-stage shift register circuit portion 52. In other words, the second-stage shift register circuit portion 52 outputs a high-level shift signal SR2 having the voltage (VDD+Vα) exceeding VDD+Vt from the node ND2. At the same time, the second-stage shift register circuit portion 52 outputs a high-level shift output signal SR12 (VDD) from the node ND3.

The liquid crystal display inputs the high-level shift signal SR2 (VDD+Vα>VDD+Vt) from the second-stage shift register circuit portion 52 in the gate of the transistor NT81 of the logic composition circuit portion 81 linked with the dummy gate line (Dummy). The liquid crystal display inputs the high-level shift signal SR2 (VDD+Vα>VDD+Vt) also in the drains of the transistors NT61 and NT66 turned on due to the scanning direction switching signal CSV of VDD in the gates thereof. Thus, the source voltages of the transistors NT61 and NT66 reach (VDD−Vt), whereby the liquid crystal display inputs the voltage (VDD−Vt) in the gates of the transistors NT2 and NT27 of the first- and third-stage shift register circuit portions 51 and 53. The liquid crystal display inputs the high-level shift output signal SR12 (VDD) from the second-stage shift register circuit portion 52 in the gates of the transistor NT21 of the third-stage shift register circuit portion 53 and the transistor NT93 through the ON-state transistor NT53 of the scanning direction switching circuit portion 60 and the transistor NT95 of the logic composition circuit 52 linked with the first-stage gate line (Gate1) respectively.

The transistor NT81 of the logic composition circuit portion 81 linked with the dummy gate line (Dummy) enters an ON-state due to the high-level shift signal SR2 (VDD+Vα) received in its gate. At this time, the liquid crystal display holds the transistors NT82 and NT83 of the logic composition circuit portion 81 in OFF- and ON-states respectively. Thus, the liquid crystal display holds the voltage of the node ND4 of the logic composition circuit portion 81 at a low level (VBB) through the low-level voltage (VBB) supplied from the lower voltage VBB through the transistor NT83. Therefore, the logic composition circuit portion 81 continuously outputs the low-level output signal Dummy (VBB) to the dummy gate line (Dummy) from the node ND4.

The transistor NT2 of the first-stage shift register circuit 51 enters an ON-state due to the voltage (VDD−Vt) received in its gate from the transistor NT61. When the shift signal SR2 goes up to a high level (VDD+Vα), the clock signal CKV1 input in the drains of the transistors NT2 and NT7 goes down to a low level at the same time. At this time, the liquid crystal display holds the voltage of the node ND1 of the first-stage shift register circuit portion 51 at a low level. Thus, the transistors NT5 and NT6 of the first-stage shift register circuit portion 51 enter OFF-states.

The gate voltage of the transistor NT7 goes low due to the clock signal CKV1 going down to the low level, whereby the transistor NT7 enters an OFF-state. Thus, the liquid crystal display holds the voltage of the node ND2 of the first-stage shift register circuit portion 51 at the high level (VDD+Vα), thereby continuously outputting the high-level shift signal SR1 (VDD+Vα) from the node ND2. The liquid crystal display holds the voltage of the node ND2 of the first-stage shift register circuit 51 at the high level (VDD+Vα) for holding the transistor NT4 in an ON-state, whereby the first-stage shift register circuit portion 51 continuously outputs a high-level shift output signal SR11 (VDD) from the node ND3.

The transistors NT27 and NT21 of the third-stage shift register circuit portion 53 enter ON-states due to the voltage (VDD−Vt) and the high-level shift output signal SR12 (VDD) received in the gates thereof respectively. At this time, the transistor NT22 of the third-stage shift register circuit portion 53 receives a low-level shift signal SR4 from the fourth-stage shift register circuit portion 54 in its gate. Thus, the transistor NT22 is in an OFF-state.

Thereafter the voltage of the start signal STV goes down to a low level, whereby the transistors NT1 and NT7 enter OFF-states and the transistors NT5 and NT6 are held in OFF-states in the first-stage shift register circuit 51. Thus, the liquid crystal display holds the voltages of the nodes ND2 and ND3 of the first-stage shift register circuit portion 51 at high levels (VDD+Vα and VDD) respectively. Therefore, the first-stage shift register circuit portion 51 continuously outputs the shift signal SR1 and the shift output signal SR11 of the high levels (VDD+Vα and VDD) from the nodes ND2 and ND3 respectively.

Thereafter the clock signal CKV1 input in the drains of the transistors NT22 and NT27 of the third-stage shift register circuit portion 53 goes up to a high level. Thus, the liquid crystal display performs operations similar to those on the aforementioned first-stage shift register circuit portion 51 also on the third-stage shift register circuit portion 53. In other words, the third-stage shift register circuit 53 outputs a high-level shift signal SR3 having the voltage (VDD+Vα) exceeding VDD+Vt and a high-level shift output signal SR13 (VDD) from the nodes ND2 and ND3 respectively.

The transistors NT82 and NT91 of the logic composition circuit portions 81 and 82 linked with the dummy gate line (Dummy) and the first-stage gate line (Gate1) respectively receive the high-level shift signal SR3 (VDD+Vα>VDD+Vt) from the third-stage shift register circuit 53 in the gates thereof. The ON-state transistors NT63 and NT68 of the input signal switching circuit portion 70 receive the high-level shift signal SR3 in the gates thereof. The transistor NT31 of the fourth-stage shift register circuit portion 54 and the transistor NT103 receive the high-level shift output signal SR13 (VDD) from the third-stage shift register circuit portion 53 in the gates thereof through the ON-state transistor NT59 of the scanning direction switching circuit portion 60 and the transistor NT105 of the logic composition circuit portion 83 linked with the second-stage gate line (Gate2) respectively.

According to the first embodiment, both of the shift signals SR2 and SR3 input in the gates of the transistors NT81 and NT82 of the logic composition circuit portion 81 linked with the dummy gate line (Dummy) respectively go high (VDD+Vα), thereby turning on both of the transistors NT81 and NT82. Thus, the liquid crystal display supplies the enable signal ENB from the enable signal line (ENB) through the transistors NT81 and NT82. This enable signal ENB is at a low level when both of the shift signals SR1 and SR2 go high, while the voltage thereof is switched from the low level to a high level after a lapse of a short period. Thus, the voltage of the node ND4 of the logic composition circuit portion 81 linked with the dummy gate line (Dummy) goes up to a high level, whereby the logic composition circuit portion 81 outputs a high-level output signal Dummy to the dummy gate line (Dummy). In other words, the liquid crystal display forcibly holds the voltage of the output signal Dummy at a low level while the enable signal ENB remains low, and raises the voltage of the output signal Dummy to a high level as the voltage of the enable signal ENB goes up from the low level to a high level.

At this time, the transistor NT84 having the gate connected to the node ND4 enters a ON-state as the voltage of the node ND4 (voltage of the output signal Dummy) of the logic composition circuit portion 81 linked with the dummy gate line (Dummy) goes up to a high level. Thus, the transistor NT83 enters an OFF-state due to a low-level voltage supplied to its gate from the lower voltage VBB through the transistor NT84. Therefore, the transistor NT83 enters the OFF state also when both of the transistors NT81 and NT82 enter ON-states, whereby the voltage of the node ND4 of the logic composition circuit portion 81 linked with the dummy gate line (Dummy) goes up as described above. The liquid crystal display inhibits a through current from flowing between the enable signal line (ENB) and the lower voltage VBB through the transistors NT81, NT82 and NT83.

According to the first embodiment, the liquid crystal display inputs the high-level shift signals SR2 and SR3 of the voltage (VDD+Vα) higher than VDD by the prescribed voltage (Vα) exceeding the threshold voltage (Vt) in the gates of the transistors NT81 and NT82 respectively in the logic composition circuit portion 81 linked with the dummy gate line (Dummy), thereby inhibiting a voltage appearing on the node ND4 of the logic composition circuit portion 81 from reaching a level lower than VDD by the threshold voltage (Vt) of the transistors NT81 and NT82. Thus, the liquid crystal display suppresses reduction of the voltage of the high-level output signal Dummy output from the logic composition circuit portion 81 to the dummy gate line (Dummy).

In the logic composition circuit portion 82 linked with the first-stage gate line (Gate1), the transistors NT91 and NT92 receive the high-level shift signal SR3 (VDD+Vα) from the third-stage shift register circuit portion 53 and the low-level shift signal SR4 from the fourth-stage shift register circuit portion 54 in the gates thereof respectively. The transistor NT93 receives the high-level shift output signal SR12 (VDD) from the second-stage shift register circuit portion 52 in its gate. Thus, the transistors NT91 and NT93 enter ON-states while the transistor NT92 enters an OFF-state in the logic composition circuit portion 82 linked with the first-stage gate line (Gate1). Therefore, the liquid crystal display holds the voltage of the node ND4 at a low level (VBB) due to the low-level voltage (VBB) supplied from the lower voltage VBB through the transistor NT93 in the logic composition circuit portion 82 linked with the first-stage gate line (Gate1). Thus, the logic composition circuit portion 82 continuously outputs a low-level output signal Gate1 (VBB) from the node ND4 to the first-stage gate line (Gate1).

The liquid crystal display inputs the high-level shift signal SR3 (VDD+Vα>VDD+Vt) in the drain of the transistor MT63 turned on due to the scanning direction switching signal CSV of VDD received in its gate, thereby setting the source voltage of the transistor NT63 to (VDD−Vt). Thus, the transistor NT12 of the second-stage shift register circuit portion 52 receives the voltage (VDD−Vt) in its gate. Therefore, the transistor NT12 enters an ON-state. At this time, the voltages of the clock signals CKV1 and CKV2 are at high and low levels respectively. The liquid crystal display holds the voltage of the node ND1 of the second-stage shift register circuit portion 52 at a low level at this time, thereby holding the transistors NT15 and NT16 in OFF-states. At this time, further, the transistor NT18, whose gate voltage goes low through the clock signal CKV2, is in an OFF-state. Therefore, the liquid crystal display holds the voltage of the node ND2 of the second-stage shift register circuit portion 52 at a high level (VDD+Vα). Thus, the second-stage shift register circuit portion 52 continuously outputs the high-level shift signal SR2 (VDD+Vα). Further, the liquid crystal display holds the transistor NT16 in an OFF-state in the second-stage shift register circuit portion 52, thereby hold the voltage of the node ND2 at a high level (VDD). Thus, the second-stage shift register circuit portion 52 continuously outputs a high-level shift output signal SR12 (VDD).

In the first-stage shift register circuit portion 51, the liquid crystal display holds the transistor NT2 in an ON-state by continuously inputting the voltage (VDD−Vt) from the transistor NT61, receiving the high-level shift signal SR2 (VDD+Vα) in its drain, in the gate thereof. In this state, the clock signal CKV1 rises from the low level (VBB) to a high level (VDD), whereby the gate voltage of the transistor NT2 goes up from (VDD−Vt) by the voltage difference between VDD and VBB while holding the gate-to-source voltage due to the MOS capacitance of the transistor NT2. Thus, the voltage of the node ND1 of the first-stage shift register circuit portion 51 goes up to the high-level voltage (VDD) without going down by the threshold voltage (Vt) of the transistor NT2.

The transistors NT5 and NT6 enter ON-states in response to the voltage of the node ND1 of the first-stage shift register circuit portion 51 going up to a high level. At this time, the transistor NT7 is in an OFF-state, whereby the liquid crystal display supplies a low-level voltage (VBB) from the lower voltage VBB through the transistor NT6 while dropping the voltage of the node ND2 of the first-stage shift register circuit portion 51 to a low level. Thus, the voltage of the shift signal SR1 output from the first-stage shift register circuit portion 51 goes down to a low level. Further, the transistor NT4 enters an OFF-state due to the voltage of the node ND2 of the first-stage shift register circuit portion 51 going down to the low level. Thus, the voltage of the node ND3 goes down to a low level due to a low-level voltage supplied from the lower voltage VBB through the transistor NT5 in the first-stage shift register circuit portion 51. Therefore, the voltage of the shift output signal SR11 output from the first-stage shift register circuit portion 51 goes down to a low level. When the voltage of the node ND1 of the first-stage shift register circuit portion 51 goes up to a high level, the liquid crystal display holds the voltage of the node ND1 at the high level until the transistor NT1 subsequently enters an ON-state by charging the capacitor C1. Thus, the liquid crystal display holds the transistors NT5 and NT6 in ON-states until the transistor NT1 subsequently enters an ON-state.

Before the voltage of the aforementioned shift signal SR1 goes down to a low level, the voltage of the enable signal ENB goes down from the high level to a low level. Thus, the voltage of the node ND4 goes down to a low level in the logic composition circuit portion 81 linked with the dummy gate line (Dummy) due to a low-level voltage supplied through the transistors NT81 and NT82. Therefore, the voltage of the output signal Dummy output from the logic composition circuit portion 81 to the dummy gate line (Dummy) goes down to a low level.

In the fourth-stage shift register circuit portion 54, the transistor NT37 receives the voltage (VDD−Vt) in its gate from the transistor NT68 receiving the high-level shift signal SR3 (VDD+Vα) in its drain. Further, the transistor NT31 receives the high-level output signal SR13 (VDD) in its gate. The transistor NT32 receives a low-level shift signal SR5 from the fifth-stage shift register circuit portion 55 in its gate. In this state, the voltage of the clock signal CKV2 input in the drains of the transistors NT32 and NT37 goes up to a high level. Thus, the liquid crystal display performs operations similar to those on the first-stage shift register circuit portion 51 also on the fourth-stage shift register circuit portion 54. In other words, the fourth-stage shift register circuit portion 45 outputs a high-level shift signal SR4 having the voltage (VDD+Vα) exceeding VDD+Vt and a high-level shift output signal SR14 (VDD) from the nodes ND2 and ND3 respectively.

According to the first embodiment, the transistor NT83 receives the high-level shift output signal SR14 (VDD) in its gate through the transistor NT86 in the logic composition circuit portion 81 linked with the dummy gate line (Dummy). Thus, the transistor NT83 enters an ON-state. Therefore, the liquid crystal display supplies a low-level voltage from the lower voltage VBB through the transistor NT83, thereby fixing the voltage of the node ND4 at a low level. Thus, the liquid crystal display fixes the voltage of the output signal Dummy output from the logic composition circuit portion 81 to the dummy gate line (Dummy) at a low level. When the transistor NT83 receives the high-level shift output signal SR14 (VDD) in its gate, the liquid crystal display charges the capacitor C81. Thus, the liquid crystal display holds the voltage of the node ND5 (gate voltage of the transistor NT83) at a high level until subsequently supplying a low-level voltage from the lower voltage VBB through the ON-state transistor NT84. Therefore, the liquid crystal display holds the transistor NT83 in an ON-state until the transistor NT84 subsequently enters an ON-state, thereby holding the voltage of the output signal Dummy output from the logic composition circuit portion 81 to the dummy gate line (Dummy) in the state fixed at the low level.

In the logic composition circuit portion 82 linked with the first-stage gate line (Gate1), the transistors NT91 and NT92 receive the high-level shift signals SR3 and SR4 (VDD+Vα) in the gates thereof respectively. Thus, both of the transistors NT91 and NT92 enter ON-states, whereby the liquid crystal display supplies the enable signal ENB from the enable signal line (ENB) through the transistors NT91 and NT92. This enable signal ENB is at a low level when both of the shift signals SR1 and SR2 go high, while the voltage thereof is switched from the low level to a high level after a lapse of a short period. Thus, the voltage of the node ND4 of the logic composition circuit portion 82 linked with the first-stage gate line (Gate1) goes up to a high level, whereby the logic composition circuit portion 82 outputs a high-level output signal Gate1 to the first-stage gate line (Gate1). In other words, the liquid crystal display forcibly holds the voltage of the output signal Gate1 at a low level while the enable signal ENB remains low, and raises the voltage of the output signal Gate1 to a high level as the voltage of the enable signal ENB goes up from the low level to a high level. Therefore, the liquid crystal display also forcibly holds the output signal Dummy output from the logic composition circuit portion 81 to the dummy gate line (Dummy) at a low level while the enable signal ENB remains low, thereby inhibiting timing for dropping the output signal Dummy from a high level to a low level and that for raising the output signal Gate1 from a low level to a high level from overlapping with each other. Thus, the liquid crystal display suppresses occurrence of noise resulting from overlapping of the timing for dropping the shift output signal Dummy from a high level to a low level and that for raising the shift output signal Gate1 from a low level to a high level.

Thereafter the liquid crystal display performs operations similar to those on the aforementioned first- to fourth-stage shift register circuit portions 51 to 54 also on the fifth-stage shift register circuit portion 55. Further, the liquid crystal display performs operations similar to those on the logic composition circuit portions 81 and 82 linked with the dummy gate line (Dummy) and the first-stage gate line (Gate1) respectively also on the logic composition circuit portion 83 linked with the second-stage gate line (Gate2). In other words, the fifth-stage shift register circuit 55 outputs a shift signal SR5, so that the logic composition circuit portion 83 linked with the second-stage gate line (Gate2) receives the shift signals SR4 and SR5 and outputs a high-level output signal Gate2 to the second-stage gate line (Gate2) due to the rise of the enable signal ENB to a high level.

As hereinabove described, the liquid crystal display according to the first embodiment shifts the timing for outputting the high-level shift signals SR1 to SR5 from the shift register circuit portions 51 to 55. Thus, the shift signals (first and second signals) subsequent and precedent to a prescribed stage relative to the scanning direction respectively do not go high at the same time.

The liquid crystal display according to the first embodiment sequentially drives (scans) the respective gate lines in the aforementioned manner. The liquid crystal display repeats the aforementioned operations until the same completes scanning the final gate line. Thereafter the liquid crystal display repeats the aforementioned operations from the first-stage shift register circuit 51.

When sequentially outputting timing-shifted output signals to the respective gate lines along the reverse direction in FIG. 2 (reverse scanning), the liquid crystal display holds the scanning direction switching signal CSV and the inverted scanning direction switching signal XCSV at low and high levels respectively. Thus, the liquid crystal display holds the transistors NT51, NT53, NT55, NT57 and NT59 and the transistors NT52, NT54, NT56, NT58 and NT60 receiving the scanning direction switching signal CSV and the inverted scanning direction switching signal XCSV in the gates thereof respectively in OFF- and ON-states respectively in the scanning direction switching circuit portion 60. Further, the liquid crystal display holds the transistors NT61 to NT70 and the transistors NT71 to NT80 receiving the scanning direction switching signal CSV and the inverted scanning direction switching signal XCSV in the gates thereof respectively in OFF- and ON-states respectively in the input signal switching circuit portion 70. In reverse scanning, the liquid crystal display performs operations similar to those in the aforementioned forward scanning on the shift register circuit portions and the logic composition circuit portions linked with the respective gate lines along the reverse direction in FIG. 2. At this time, the liquid crystal display inputs a shift signal (first signal) in a prescribed shift register circuit portion from a subsequent shift register circuit portion or inputs a shift signal (second signal) and a shift output signal in the prescribed shift register circuit portion from a precedent shift register circuit portion relative to the scanning direction through the ON-state transistors NT52, NT54, NT56, NT58 and NT60 of the scanning direction switching circuit portion 60 and the ON-state transistors NT71 to NT80 of the input signal switching circuit portion 70.

According to the first embodiment, as hereinabove described, the liquid crystal display is provided with the transistors (NT2, NT12, NT22, NT32 and NT42) turned on in response to the subsequent shift signals (first signals) and the transistors (NT7, NT17, NT27, NT37 and NT47) turned on in response to the precedent shift signals (second signals) relative to the scanning direction so that high-level periods of these shift signals (first and second signals) do not overlap with each other, whereby the transistors (NT2, NT12, NT22, NT32 and NT42) turned on in response to the shift signals (first signals) and the transistors (NT7, NT17, NT27, NT37 and NT47) turned on in response to the shift signals (second signals) do not enter ON-states at the same time. When the scanning direction is forward in this case, the liquid crystal display turns on the transistor NT16 by turning on the transistor NT12 in response to the third-stage (subsequent) shift signal SR3 (second signal) in the second-stage (prescribed) shift register circuit portion 52, for example, whereby the transistor NT16 and the transistor NT17 turned on in response to the first-stage (precedent) shift signal SR1 (first signal) do not enter ON-states at the same time. Thus, the liquid crystal display can inhibit a through current from flowing between the lower voltage VBB and the clock signal line (CKV2) through the transistors NT16 and NT17.

Further, the liquid crystal display turns on the transistor NT14 by turning on the transistor NT17 in response to the first-stage (precedent) shift signal SR1 (first signal) while turning on the transistor NT15 by turning on the transistor NT12 in response to the third-stage (subsequent) shift signal SR3 (second signal), whereby the transistors NT14 and NT15 do not enter ON-states at the same time. Thus, the liquid crystal display can inhibit a through current from flowing between the lower and higher voltages VBB and VDD through the transistors NT14 and NT15. Further, the liquid crystal display turns on the transistor NT11 in response to the first-stage (precedent) shift output signal SR11, whereby the transistor NT11 and the transistor NT12 turned on in response to the third-stage (subsequent) shift output signal SR3 do not enter ON-states at the same time either. Thus, the liquid crystal display can also inhibit a through current from flowing between the lower voltage VBB and the clock signal line (CKV2) through the transistors NT11 an NT12.

Also in the first- and third- to fifth-stage shift register circuit portions 51 and 53 to 55, the liquid crystal display can inhibit through currents from flowing, similarly to the above.

According to the first embodiment, further, the liquid crystal display, provided with the input signal switching circuit portion 70 for switching the shift signals (subsequent shift signals (first signals) and precedent shift signals (second signals) relative to the scanning direction) supplied to the transistors NT2, NT12, NT22, NT32 and NT42 and the transistors NT7, NT17, NT27, NT37 and NT47 respectively in response to the scanning direction, can suppress generation of through currents in the shift register circuit portions 51 to 55 also when switching the scanning direction. Thus, the liquid crystal display according to the first embodiment having a bidirectional scanning direction can be inhibited from increase of power consumption.

According to the first embodiment, the liquid crystal display, turning on the transistors NT2, NT12, NT22, NT32 and NT42 and the transistors NT7, NT17, NT27, NT37 and NT47 in response to the subsequent shift signals (first signals) and the precedent shift signals (second signals) relative to the scanning direction respectively so that the high-level periods of the subsequent and precedent shift signals (first and second signals) do not overlap with each other relative to the scanning direction, can control the transistors (NT7, NT17, NT27, NT37 and NT47) turned on in response to the shift signals (second signals) to enter OFF-states when the transistors (NT2, NT12, NT22, NT32 and NT42) turned on in response to the shift signals (first signals) are in ON-states. Further, the liquid crystal display can control the transistors (NT2, NT12, NT22, NT32 and NT42) turned on in response to the shift signals (first signals) to enter OFF-states when the transistors (NT7, NT17, NT27, NT37 and NT47) turned on in response to the shift signals (second signals) are in ON-states.

According to the first embodiment, the capacitors C2, C12, C22, C32 and C42 are connected between the gates and the sources of the transistors NT4, NT14, NT24, NT34 and NT44 respectively so that the liquid crystal display can raise or drop the gate voltage of the transistor NT14 following rise or fall of the source voltage power supply source of the transistor NT14 in order to maintain the gate-to-source voltage of the transistor NT14 connected with the capacitor C12 in the second-stage shift register circuit portion 52, for example. Thus, the liquid crystal display can reliably hold the transistor NT14 in an ON-state.

According to the first embodiment, the liquid crystal display provided with the input signal switching circuit portion 70 including the transistors NT51, NT53, NT55, NT57 and NT59 turned on in forward scanning and the transistors NT52, NT54, NT56, NT58 and NT60 turned on in reverse scanning for inputting the shift signals (SR1 to SR5) in the shift register circuit portions (51 to 55) through the transistors (NT51 to NT60) constituting the input signal switching circuit portion 70 respectively can easily input the subsequent shift signals and the precedent shift signals (first and second signals) in the first and second circuit portions (51a to 55a and 51b to 55b) relative to the scanning direction respectively.

According to the first embodiment, all transistors constituting the V driver 5 are of the same conductive type (n type), whereby the numbers of ion implantation steps and ion implantation masks can be inhibited from increase when forming the transistors of the V driver 5. Thus, the manufacturing process can be inhibited from complication, and the manufacturing cost can be inhibited from increase.

According to the first embodiment, each of the transistors NT1, NT2, NT6, NT7 and NT8 has two electrically connected gate electrodes in the first-stage shift register circuit portion 51, whereby the liquid crystal display can distribute voltages applied to the transistors NT1, NT2, NT6, NT7 and NT8 between the sources and the drains corresponding to the respective gate electrodes through the pairs of gate electrodes. In this case, the liquid crystal display, capable of reducing the voltages applied between the sources and the drains corresponding to the respective gate electrodes of the transistors NT1, NT2, NT6, NT7 and NT8, can suppress deterioration of characteristics resulting from application of large voltages to the transistors NT1, NT2, NT6, NT7 and NT8. The liquid crystal display can attain similar effects also in the second- to fifth-stage shift register circuit portions 52 to 55. Thus, the liquid crystal display including the shift register circuit portions 51 to 55 can be inhibited from reduction of scanning characteristics.

According to the first embodiment, the diode-connected transistors NT3 and NT8 are provided between the gates of the transistors NT6 and NT4 and the transistors NT2 and NT7 respectively in the first-stage shift register circuit portion 51, whereby the liquid crystal display can intercept transmission of noise generated when the transistor NT6 is turned on or off to the transistor NT2 with the transistor NT3 while intercepting transmission of noise generated when the transistor NT4 is turned on or off to the transistor NT7 with the transistor NT8. The liquid crystal display can attain similar effects also in the second- to fifth-stage shift register circuit portions 52 to 55.

According to the first embodiment, the V driver 5 includes the precedent shift register circuit portions 52 to 55 outputting the shift signals SR2 to SR5 respectively, the subsequent shift register circuit portions 53 to 55 outputting the shift signals SR3 to SR5 respectively and the logic composition circuit portions 81 to 83 outputting the shift output signals Dummy, Gate1 and Gate2 by logically compositing the precedent and subsequent shift signals with each other in its shift register circuit, whereby the logic composition circuit portion 81 can output the shift output signal Dummy by logically compositing the shift signals SR2 and SR3 from the second- and third-stage shift register circuit portions 52 and 53 with each other and the logic composition circuit 82 can output the subsequent shift output signal Gate1 not going high at the same time with the aforementioned shift output signal Dummy by logically compositing the shift signals SR3 and SR4 from the third- and fourth-stage shift register circuit portions 53 and 54 with each other, for example. Thus, the liquid crystal display can share the single-stage shift register circuit portion 53 between the two shift register circuit portions 52 and 53 employed for outputting the shift output signal Dummy and the two shift register circuit portions 53 and 54 employed for outputting the subsequent shift output signal Gate1. Therefore, the number of the shift register circuit portions constituting the shift register circuit of the V driver 5 can be reduced, whereby the liquid crystal display including the V driver 5 can be simplified in circuit structure.

According to the first embodiment, the liquid crystal display, turning off the transistor NT83 (NT93 or NT103) when the shift signals SR2 (SR3 or SR4) and SR3 (SR4 or SR5) input in the gates of the transistors NT81 (NT91 or NT101) and NT82 (NT92 or NT102) respectively are at high levels in each logic composition circuit portion, can turn off the transistor NT83 (NT93 or NT103) when the transistors NT81 (NT91 or NT101) and NT82 (NT92 or NT102) are in ON-states. Thus, the liquid crystal display can inhibit a through current from flowing between the enable signal line (ENB) and the lower voltage VBB through the transistors NT81 (NT91 or NT101), NT82 (NT92 or NT102) and NT83 (NT93 or NT103). Therefore, the liquid crystal display including the V driver 5 can suppress increase of current consumption.

Second Embodiment

Figure 4:
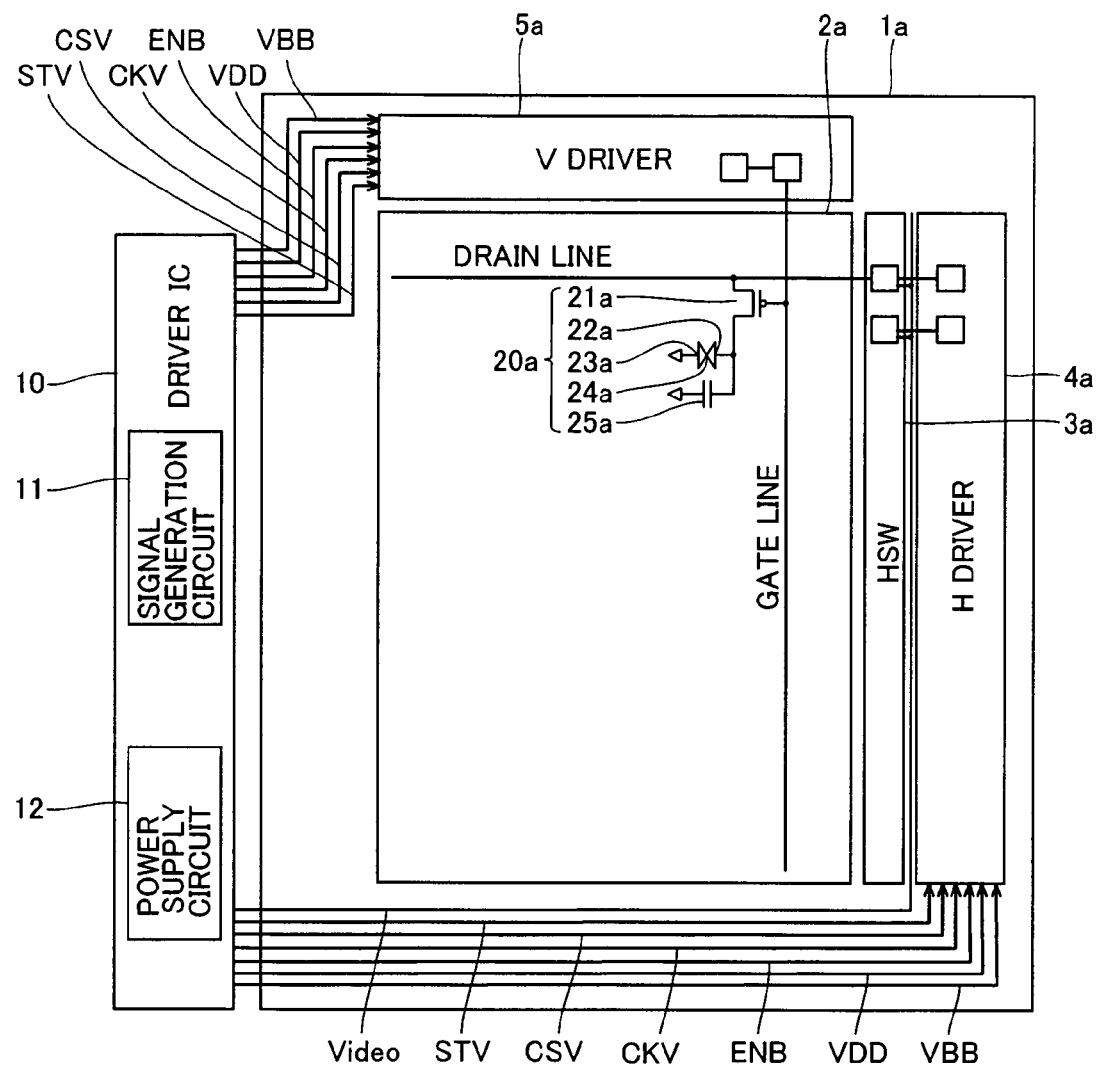
FIG. 4 is a plan view showing a liquid crystal display according to a second embodiment of the present invention.
Figure 5:
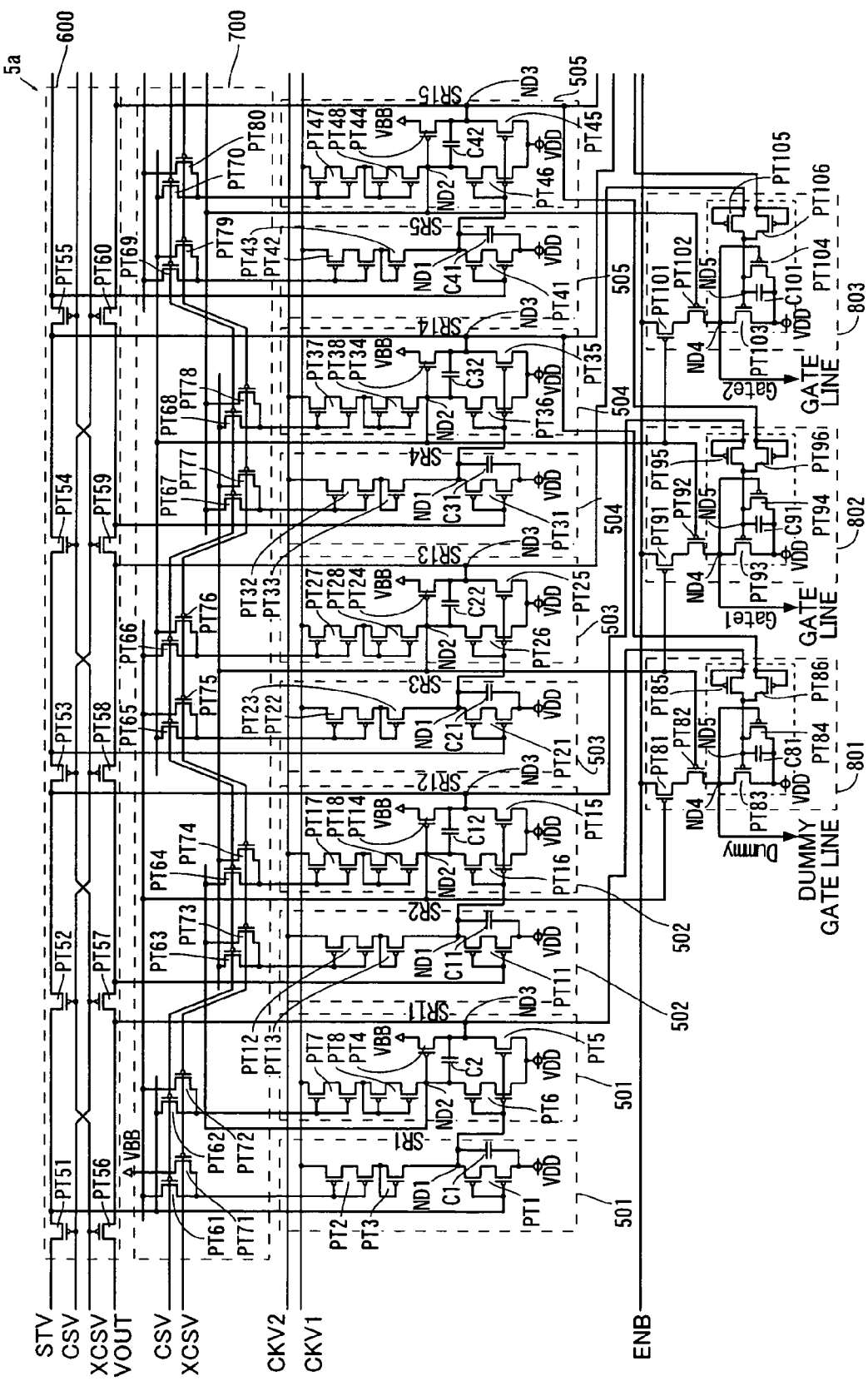
FIG. 5 is a circuit diagram inside a V driver of the liquid crystal display according to the second embodiment shown in FIG. 4.

Referring to FIGS. 4 and 5, a V driver 5a similar to the V driver 5 according to the aforementioned first embodiment is constituted of p-channel transistors in a liquid crystal display according to a second embodiment of the present invention.

Referring to FIG. 4, a display portion 2a is provided on a substrate 1a in the liquid crystal display according to the second embodiment. On this display portion 2a, pixels 20a are arranged in the form of a matrix. FIG. 4 shows only one pixel 20a, in order to simplify the illustration. Each pixel 20a is constituted of a p-channel transistor 21a (hereinafter referred to as a transistor 21a), a pixel electrode 22a, a common electrode 23a, common to the respective pixels 20a, opposed to the pixel electrode 22a, a liquid crystal 24a held between the pixel electrode 22a and the common electrode 23a and a subsidiary capacitor 25a. The source of the transistor 21a is connected to a drain line, and the drain thereof is connected to the pixel electrode 22a and the subsidiary capacitor 25a. The gate of this transistor 21a is connected to a gate line.

Horizontal switches (HSW) 3a and an H driver 4a for driving (scanning) drain lines of the display portion 2a are provided on the substrate 1a along one edge of the display portion 2a. A V driver 5a for driving (scanning) gate lines of the display portion 2a is provided along another edge of the display portion 2a. While FIG. 4 illustrates only two horizontal switches 3a, the horizontal switches 3a are arranged in a number responsive to the pixel number in practice. While each of the H and V drivers 4a and 5a shown in FIG. 4 has only two shift register circuit portions, the shift register circuit portions are arranged in a number responsive to the pixel number in practice. A driver IC 10 including a signal generation circuit 11 and a power supply circuit 12 is set outside the substrate 1a, similarly to the aforementioned first embodiment.

Referring to FIG. 5, the V driver 5a according to the second embodiment has a structure substantially similar to that of the V driver 5 according to the aforementioned first embodiment, except that a plurality of shift register circuit portions 501 to 505, a scanning direction switching circuit portion 600, an input signal switching circuit portion 700 and a plurality of logic composition circuit portions 801 to 803 in the V driver 5a are constituted of p-channel transistors (PT1 to PT8, PT11 to PT18, PT21 to PT28, PT31 to PT38, PT41 to PT48, PT51 to PT60, PT61 to PT80, PT81 to PT86, PT91 to PT96 and PT101 to PT106), dissimilarly to the first embodiment. While FIG. 5 shows only five stages of shift register circuit portions 501 to 505 and three stages of logic composition circuit portions 801 to 803 in order to simplify the illustration, the shift register circuit portions and the logic composition circuit portions are provided in numbers responsive to the pixel number respectively in practice.

Figure 6:
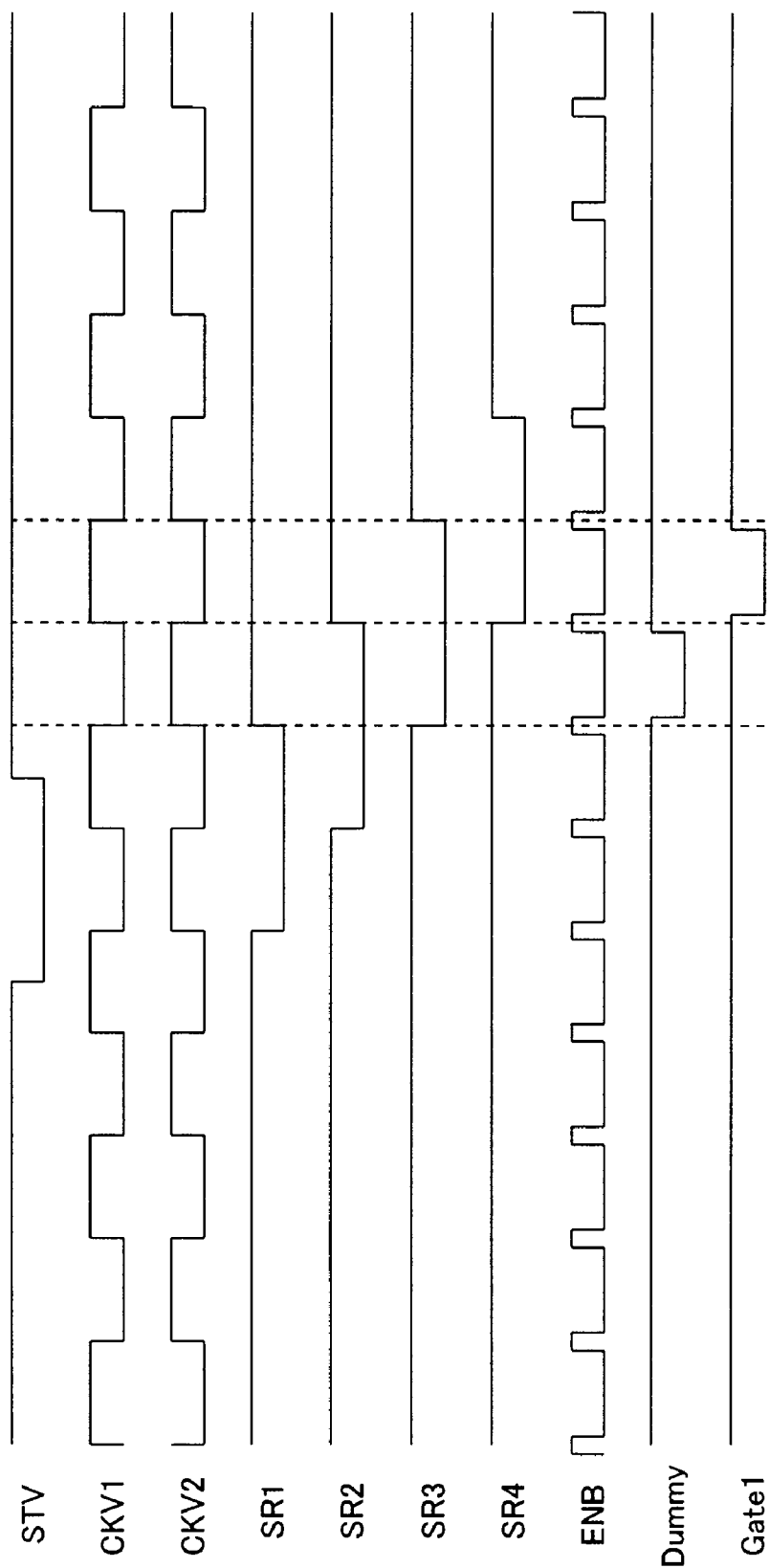
FIG. 6 is a voltage waveform diagram for illustrating operations of the V driver of the liquid crystal display according to the second embodiment of the present invention.

Operations of the V driver 5a according to the second embodiment are now described with reference to FIGS. 5 and 6. The V driver 5a according to the second embodiment inputs signals obtained by inverting the high and low levels of the start signal STV, the clock signals CKV1 and CKV2 and the enable signal ENB according to the first embodiment shown in FIG. 3 respectively as a start signal STV, clock signals CKV1 and CKV2 and an enable signal ENB respectively. Thus, the shift register circuit portions 501 to 505 according to the second embodiment output signals having waveforms obtained by inverting the high and low levels of the shift signals SR1 to SR5 from the shift register circuit portions 51 to 55 according to the first embodiment respectively. Further, the logic composition circuit portions 801 to 803 according to the second embodiment output signals having waveforms obtained by inverting the high and low levels of the output signals Dummy, Gate1 and Gate2 output from the logic composition circuit portions 81 to 83 according to the first embodiment respectively. The remaining operations of the V driver 5a according to the second embodiment are similar to those of the V driver 5 according to the aforementioned first embodiment.

The liquid crystal display according to the second embodiment can attain effects such as suppression of increase of current consumption in the V driver 5a similarly to the aforementioned first embodiment, due to the aforementioned structure.

Third Embodiment

Figure 7:
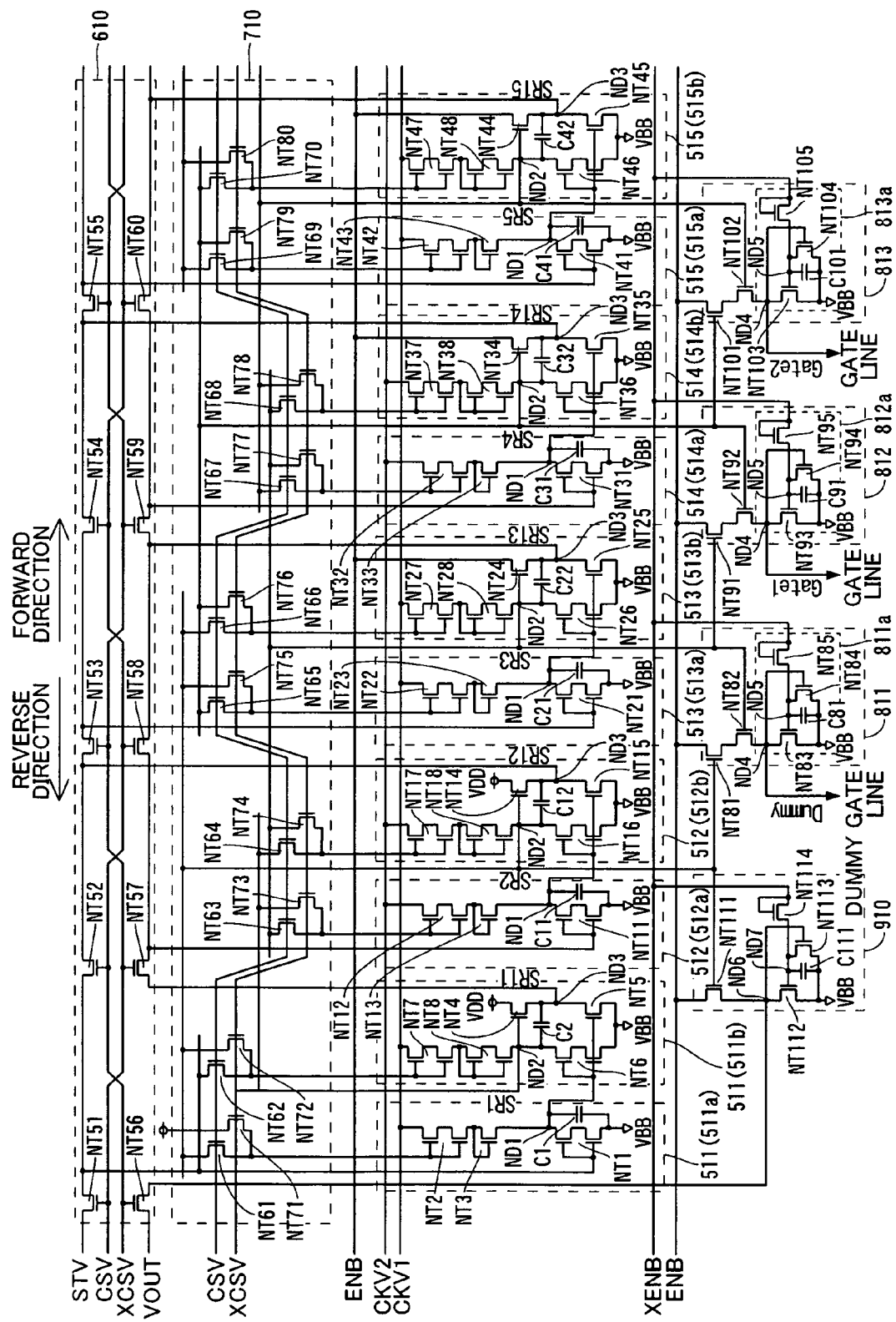
FIG. 7 is a circuit diagram inside a V driver of a liquid crystal display according to a third embodiment of the present invention.

Referring to FIG. 7, a liquid crystal display according to a third embodiment of the present invention supplies an enable signal to the drains of transistors connected to nodes, outputting shift output signals, of third-stage and subsequent shift register circuit portions in place of a higher voltage in a structure similar to that of the aforementioned first embodiment.

According to the third embodiment, the liquid crystal display is provided with a plurality of stages of shift register circuit portions 511 to 515, a scanning direction switching circuit portion 610, an input signal switching circuit portion 710 and a plurality of logic composition circuit portions 811 to 813, as shown in FIG. 7. While FIG. 7 shows only five stages of shift register circuit portions 511 to 515 and three stages of logic composition circuit portions 811 to 813 in order to simplify the illustration, the shift register circuit portions and the logic composition circuit portions are provided in numbers corresponding to a pixel number in practice respectively.

The first-stage shift register circuit portion 511 is constituted of first and second circuit portions 511a and 511b having circuit structures similar to those of the first and second circuit portions 51a and 51b of the first-stage shift register circuit 51 according to the first embodiment shown in FIG. 2 respectively. The second-stage shift register circuit portion 512 is constituted of first and second circuit portions 512a and 512b having circuit structures similar to those of the first and second circuit portions 52a and 52b of the second-stage shift register circuit 52 according to the first embodiment shown in FIG. 2 respectively.

According to the third embodiment, an enable signal line (ENB) is connected to the third-, fourth- and fifth-stage shift register circuit portions 513, 514 and 515 respectively.

More specifically, the third-stage shift register circuit portion 513 is constituted of first and second circuit portions 513a and 513b. The first and second circuit portions 513a and 513b have circuit structures similar to those of the first and second circuit portions 53a and 53b of the third-stage shift register circuit portion 53 according to the first embodiment shown in FIG. 2 respectively. According to the third embodiment, the enable signal line (ENB) is connected to the drain of a transistor NT24.

The fourth-stage shift register circuit portion 514 is constituted of first and second circuit portions 514a and 514b. The first and second circuit portions 514a and 514b have circuit structures similar to those of the first and second circuit portions 54a and 54b of the fourth-stage shift register circuit portion 54 according to the first embodiment shown in FIG. 2 respectively. According to the third embodiment, the enable signal line (ENB) is connected to the drain of a transistor NT34.

The fifth-stage shift register circuit portion 515 is constituted of first and second circuit portions 515a and 515b. The first and second circuit portions 515a and 515b have circuit structures similar to those of the first and second circuit portions 55a and 55b of the fifth-stage shift register circuit portion 55 according to the first embodiment shown in FIG. 2 respectively. According to the third embodiment, the enable signal line (ENB) is connected to the drain of a transistor NT44.

The scanning direction switching circuit portion 610 according to the third embodiment has a circuit structure similar to that of the scanning direction switching circuit portion 60 according to the first embodiment shown in FIG. 2. According to the third embodiment, however, either the drain or the source of a transistor NT56 and either the source or the drain of a transistor NT57 are not connected with each other.

The input signal switching circuit portion 710 according to the third embodiment has a circuit structure similar to that of the input signal switching circuit portion 70 according to the first embodiment shown in FIG. 2.

The logic composition circuit portion 811 connected to a dummy gate line according to the third embodiment includes transistors NT81 to NT84, a diode-connected transistor NT85 and a capacitor C81. In other words, the logic composition circuit portion 811 according to the third embodiment has a circuit structure obtained by eliminating the diode-connected transistor NT86 from that of the logic composition circuit portion 81 according to the first embodiment shown in FIG. 2. The transistors NT83 to NT85 and the capacitor C81 constitute a voltage fixing circuit portion 811a. A node ND5 of the logic composition circuit portion 811 according to the third embodiment is connected to an inverted enable signal line (XENB) through the transistor NT85.

The logic composition circuit portion 812 connected to a first-stage gate line includes transistors NT91 to NT94, a diode-connected transistor NT95 and a capacitor C91. In other words, the logic composition circuit portion 812 according to the third embodiment has a circuit structure obtained by eliminating the diode-connected transistor NT96 from that of the logic composition circuit portion 82 according to the first embodiment shown in FIG. 2. The transistors NT93 to NT95 and the capacitor C91 constitute a voltage fixing circuit portion 812a. A node ND5 of the logic composition circuit portion 812 according to the third embodiment is connected to the inverted enable signal line (XENB) through the transistor NT95.

The logic composition circuit portion 813 connected to a second-stage gate line includes transistors NT101 to NT104, a diode-connected transistor NT105 and a capacitor C101. In other words, the logic composition circuit portion 813 according to the third embodiment has a circuit structure obtained by eliminating the diode-connected transistor NT106 from that of the logic composition circuit portion 83 according to the first embodiment shown in FIG. 2. The transistors NT103 to NT105 and the capacitor C101 constitute a voltage fixing circuit portion 813a. A node ND5 of the logic composition circuit portion 813 according to the third embodiment is connected to the inverted enable signal line (XENB) through the transistor NT95.

According to the third embodiment, a circuit portion 910 is provided in addition to the plurality of stages of shift register circuit portions 511 to 515, the scanning direction switching circuit portion 610, the input signal switching circuit portion 710 and the plurality of stages of logic composition circuit portions 811 to 813. This circuit portion 910 includes n-channel transistors NT111 to NT113, a diode-connected n-channel transistor NT114 and a capacitor C111. The n-channel transistors NT111 to NT114 are hereinafter referred to as transistors NT111 to NT114 respectively.

According to the third embodiment, all of the transistors NT111 to NT114 constituting the circuit portion 910 are constituted of TFTs formed by n-type MOS transistors.

The drain and the source of the transistor NT111 are connected to the enable signal line (ENB) and a node ND6 respectively. The gate of this transistor NT111 is connected to a node ND2 of the second-stage shift register circuit portion 512. The source and the drain of the transistor NT112 are connected to a lower voltage VBB and the node ND6 respectively. The gate of this transistor NT112 is connected to another node ND7. The source and the drain of the transistor NT113 are connected to the lower voltage VBB and the node ND7 respectively. The gate of this transistor NT113 is connected to the node ND6. First and second electrodes of the capacitor C111 are connected to the lower voltage VBB and the node ND7 respectively. The node ND6 is connected to either the drain or the source of the transistor NT56 of the scanning direction switching circuit portion 610. The node ND7 is connected to the inverted enable signal line (XENB) through the transistor NT114.

Operations of a V driver of the liquid crystal display according to the third embodiment are described with reference to FIGS. 7 and 8.

The operations of the V driver according to the third embodiment are basically similar to those of the V driver 5 according to the aforementioned first embodiment. However, the V driver according to the third embodiment supplies an enable signal ENB to the drains of the transistors NT24, NT34 and NT44 connected to the nodes ND3 of the third- to fifth-stage shift register circuit portions 513 to 515 outputting shift output signals SR13 to SR15 respectively in place of the higher voltage VDD. The V driver further inputs an inverted enable signal XENB in the gates of the transistors NT83, NT93 and NT103 of the logic composition circuit portions 811 to 813 connected between the lower voltage VBB and the nodes ND4 outputting output signals respectively.

More specifically, operations on the first- and second-stage shift register circuit portions 511 and 512 (see FIG. 7) are similar to those on the first- and second-stage shift register circuit portions 51 and 52 according to the first embodiment shown in FIG. 2 respectively. The second-stage shift register circuit portion 512 inputs a high-level shift signal SR2 (VDD+Vα) in the drain of the transistor NT66. Thus, the source voltage of the transistor NT66 turned on due to a scanning direction switching signal CSV of a voltage VDD supplied to its gate reaches a level (VDD−Vt). Therefore, the transistor NT27 of the third-stage shift register circuit portion 513 receives the voltage (VDD−Vt) in its gate. The transistor NT21 receives a high-level shift output signal SR12 (VDD) in its gate. The transistor NT22 receives a low-level shift signal SR4 from the fourth-stage shift register circuit portion 514 in its gate. Thus, the transistors NT21 and NT27 enter ON-states, while the transistor NT22 enters an OFF-state. Therefore, the voltage of the node ND1 goes down to a low level due to a low-level voltage supplied thereto from the lower voltage VBB through the transistor NT21. Thus, the transistors NT25 and NT26 enter OFF-states. In this state, a clock signal CKV1 input in the drain of the transistor NT27 goes up from a low level to a high level. Thus, the voltage of the node ND2 of the third-stage shift register circuit portion 513 also goes up to a high level, thereby turning on the transistor NT24. At this time, the liquid crystal display supplies a low-level enable signal ENB to the drain of the transistor NT24, thereby holding the source voltage of the transistor NT24 (voltage of the node ND3) at a low level.

According to the third embodiment, the voltage of the enable signal ENB goes up from the low level to a high level. Thus, the voltage of the node ND3 of the third-stage shift register circuit portion 513 also goes up to a high level. At this time, the liquid crystal display boots and raises the voltage of the node ND2 of the third-stage shift register circuit portion 513 following rise of the voltage of the node ND3, in order to maintain the gate-to-source voltage of the transistor NT24 through the capacitor C22. Thus, the voltage of the node ND2 of the third-stage shift register circuit portion 513 goes up to a level (VDD+Vβ>VDD+Vt) higher than VDD by a prescribed voltage (Vβ) exceeding the threshold voltage (Vt). The current voltage (VDD+Vβ) of the node ND2 is higher than the raised voltage (VDD+Vα) of the node ND2 in the aforementioned first embodiment. Then, the third-stage shift register circuit portion 513 outputs a high-level shift signal SR3 having the voltage (VDD+Vβ) exceeding VDD+Vt from its node ND2. Also the fourth- and fifth-stage shift register circuit portions 514 and 515 output high-level shift signals SR4 and SR5 having the voltage (VDD+Vβ) exceeding VDD+Vt higher than the high-level shift signals (VDD+Vα) output from the shift register circuit portions according to the aforementioned first embodiment.

The transistors NT63 and NT68 receive the high-level shift signal SR3 from the third-stage shift register circuit portion 513 in the drains thereof respectively. Thus, both of the source voltages of the transistors NT63 and NT68 turned on due to the scanning direction switching signal CSV of the voltage VDD supplied to the gates thereof reach the level (VDD−Vt). Therefore, the transistors NT12 and NT37 of the second- and fourth-stage shift register circuit portions 512 and 514 receive the voltage (VDD−Vt) in the gates thereof. In this state, a clock signal CKV2 rises from a low level (VBB) to a high level (VDD), thereby raising the gate voltage of the transistor NT12 of the second-stage shift register circuit portion 512 from (VDD−Vt) by the voltage difference between VDD and VBB while holding the gate-to-source voltage through the MOS capacitance of the transistor NT12. Thus, the liquid crystal display inhibits a voltage generated on the node ND1 of the transistor NT12 from reduction from VD by the threshold voltage (Vt) of the transistor NT12. Therefore, the liquid crystal display suppresses reduction of a high-level voltage generated on the node ND1 of the second-stage shift register circuit portion 512. Further, the clock signal CKV2 rises from the low level (VBB) to the high level (VDD) while the transistor NT37 of the fourth-stage shift register circuit portion 514 receives the voltage (VDD−Vt) in its gate, thereby raising the gate voltage of the transistor NT37 from (VDD−Vt) by the voltage difference between VDD and VBB while holding the gate-to-source voltage through the MOS capacitance of the transistor NT37. Thus, the liquid crystal display inhibits a voltage generated on the node ND2 of the transistor NT37 from reduction from VDD by the threshold voltage (Vt) of the transistor NT37. Therefore, the liquid crystal display suppresses reduction of a high-level voltage generated on the node ND2 of the fourth-stage shift register circuit portion 514. The liquid crystal display suppresses reduction of high-level voltages generated on the nodes ND1 and ND2 in each shift register circuit portion in the aforementioned manner when the voltage of the node ND1 or ND2 goes up following rise of the voltage of the clock signal CKV1 or CKV2 to the high level (VDD).

The transistor NT91 of the logic composition circuit portion 812 linked with the first-stage gate line also receives the high-level shift signal SR3 (VDD+Vβ) from the third-stage shift register circuit portion 513 in its gate. The transistor NT92 of the logic composition circuit portion 812 linked with the first-stage gate line receives a high-level shift signal SR4 (VDD+Vβ) from the fourth-stage shift register circuit portion 514 in its gate. Thus, the liquid crystal display inhibits a voltage generated on the node ND4 of the transistor NT92 from reaching a high level lower than VDD by the threshold voltage (Vt) of the transistors NT91 and NT92 when the voltage of the enable signal ENB input in the drain of the transistor NT91 goes up to the high level (VDD). Also in the logic composition circuit portion 813 linked with the second-stage gate line, the liquid crystal display suppresses remarkable reduction of the high-level voltage generated on the node ND4 in the aforementioned manner when the voltage of the node ND4 goes up following rise of the enable signal ENB to the high level (VDD).

According to the third embodiment, the liquid crystal display fixes the voltages of the output signals output from the logic composition circuit portions 811 to 813 to the respective gate lines to low levels through the inverted enable signal XENB. For example, the logic composition circuit portion 812 linked with the first-stage gate line is supplied with a high-level enable signal ENB through the ON-state transistors NT91 and NT92 so that an output signal Gate1 output to the first-stage gate line is at a high level. Thereafter the voltage of the enable signal ENB goes down to a low level while that of the inverted enable signal XENB goes up to a high level. Thus, the liquid crystal display supplies the low-level enable signal ENB through the transistors NT91 and NT92, thereby dropping the voltage of the output signal Gate1 output to the first-stage gate line to a low level.

In the logic composition circuit portion 812 linked with the first-stage gate line, the transistor NT93 receives the high-level inverted enable signal XENB in its gate through the diode-connected transistor NT95. Thus, the transistor NT93 enters an ON-state. The liquid crystal display supplies a low-level voltage from the lower voltage VBB to the node ND4 through the transistor NT93. Thus, the liquid crystal display fixes the voltage of the output signal Gate1 output from the logic composition circuit portion 812 to the first-stage gate line to a low level.

In the logic composition circuit portion 812 linked with the first-stage gate line, the liquid crystal display charges the capacitor C91 when supplying the high-level inverted enable signal XENB to the gate of the transistor NT93. Thus, the liquid crystal display holds the gate voltage of the transistor NT93 (voltage of the node ND5) at a high level until the same supplies a low-level voltage from the lower voltage VBB through the transistor NT94 by subsequently turning on the transistor NT94. Therefore, the liquid crystal display holds the transistor NT93 in an ON-state until the transistor NT94 subsequently enters an ON-state, thereby holding the output signal Gate1 in the state fixed to the low level through the low-level voltage supplied from the lower voltage VBB through the transistor NT93. The liquid crystal display fixes the voltages of the output signals to low levels in the logic composition circuit portions 811 to 813 with the inverted enable signal XENB in the aforementioned manner.

The remaining operations of the V driver according to the third embodiment are similar to those of the V driver 5 according to the aforementioned first embodiment.

According to the third embodiment, as hereinabove described, the liquid crystal display, capable of fluctuating the source voltage from VBB to VDD when the transistor NT24 is in an ON-state in the third-stage shift register circuit portion 513, for example, by supplying the enable signal ENB periodically switched between the higher and lower voltages VDD and VBB to the drains of the transistors NT24, NT34 and NT44 connected to the nodes ND3 of the shift register circuit portions 513 to 515 outputting the shift output signals SR13 to SR15 respectively, can raise the gate voltage of the transistor NT24 by the fluctuation (Vβ) of the source voltage. Thus, the liquid crystal display can more reliably hold the transistor NT24 in an ON-state as compared with a case of connecting the drain of the transistor NT24 to the fixed lower voltage VBB.

According to the third embodiment, as hereinabove described, the liquid crystal display can raise the source voltage of the transistor NT24 from a low level (VBB) to a high level (VDD) through the enable signal ENB after turning on the transistor NT24 following the operation of raising the gate voltage of the transistor NT24 from a low level (VBB) to a high level (VDD) through the clock signal CKV1 in the third-stage shift register circuit portion 513, for example, by connecting the enable signal line to the drains of the transistors NT24, NT34 and NT44 and supplying the clock signal CKV1 (CKV2) to the gates thereof in the shift register circuit portions 513 to 515 while switching the enable signal ENB from a low level to a high level after raising the clock signal CKV1 (CKV2) from a low level to a high level. Thus, the liquid crystal display can raise the gate voltage of the transistor NT24 by the current rise (Vβ) of the source voltage of the transistor NT24. Further, the liquid crystal display can raise the source voltage of the transistor NT34 from a low level (VBB) to a high level (VDD) after turning on the transistor NT34 following an operation of raising the gate voltage of the transistor NT34 from a low level (VBB) to a high level (VDD) through the clock signal CKV2 in the fourth-stage shift register circuit portion 514. Thus, the liquid crystal display can raise the gate voltage of the transistor NT34 by the current rise (Vβ) of the source voltage of the transistor NT34. Thus, the liquid crystal display, capable of further raising the voltages (VDD+Vβ>VDD+Vt) of the shift signals SR3 and SR4 as compared with a case of connecting the drains of the transistors NT24 and NT34 to the fixed higher voltage VDD, can more easily set the voltages of the shift signals SR3 and SR4 to the level higher than VDD by at least the threshold voltage (Vt). Therefore, the liquid crystal display can more reliably supply the shift signals SR3 and SR4 having the voltages exceeding VDD+Vt to the gates of the transistors NT91 and NT92 of the logic composition circuit portion 812 linked with the first-stage gate line respectively. Thus, the liquid crystal display can further inhibit the voltage of the shift output signal Gate1 output to the first-stage gate line through the transistors NT91 and NT92 of the logic composition circuit portion 812 from reduction by the threshold voltage (Vt).

The remaining effects of the third embodiment are similar to those of the aforementioned first embodiment.

Fourth Embodiment

Figure 9:
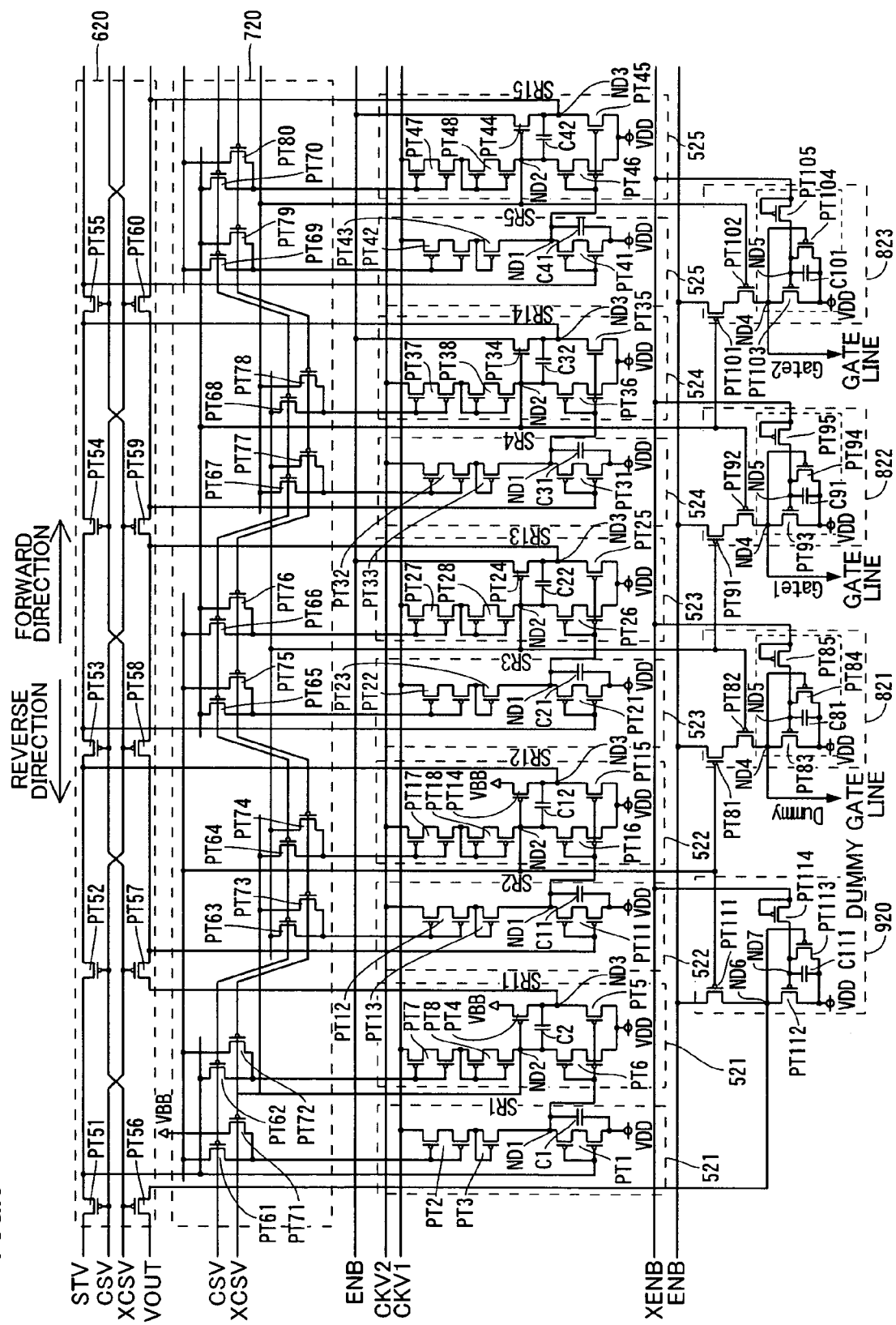
FIG. 9 is a circuit diagram inside a V driver of a liquid crystal display according to a fourth embodiment of the present invention.

Referring to FIG. 9, a V driver similar to that according to the aforementioned third embodiment is constituted of p-channel transistors in a liquid crystal display according to a fourth embodiment of the present invention.

In other words, the V driver of the liquid crystal display according to the fourth embodiment is substantially similar in structure to the V driver of the liquid crystal display according to the aforementioned third embodiment, as shown in FIG. 9. The V driver according to the fourth embodiment is different from that according to the third embodiment in a point that a plurality of shift register circuit portions 521 to 525, a scanning direction switching circuit portion 620, an input signal switching circuit portion 720, a plurality of stages of logic composition circuit portions 821 to 823 and a circuit portion 920 are constituted of p-channel transistors (PT1 to PT8, PT11 to PT18, PT21 to PT28, PT31 to PT38, PT41 to PT48, PT51, to PT60, PT61 to PT80, PT81 to PT85, PT91, PT95, PT101 to PT105 and PT111 to PT114), dissimilarly to the third embodiment. While FIG. 9 shows only five stages of shift register circuit portions 521 to 525 and three stages of logic composition circuit portions 821 to 823 in order to simplify the illustration, the shift register circuit portions and the logic composition circuit portions are provided in numbers corresponding to a pixel number in practice respectively.

Figure 10:
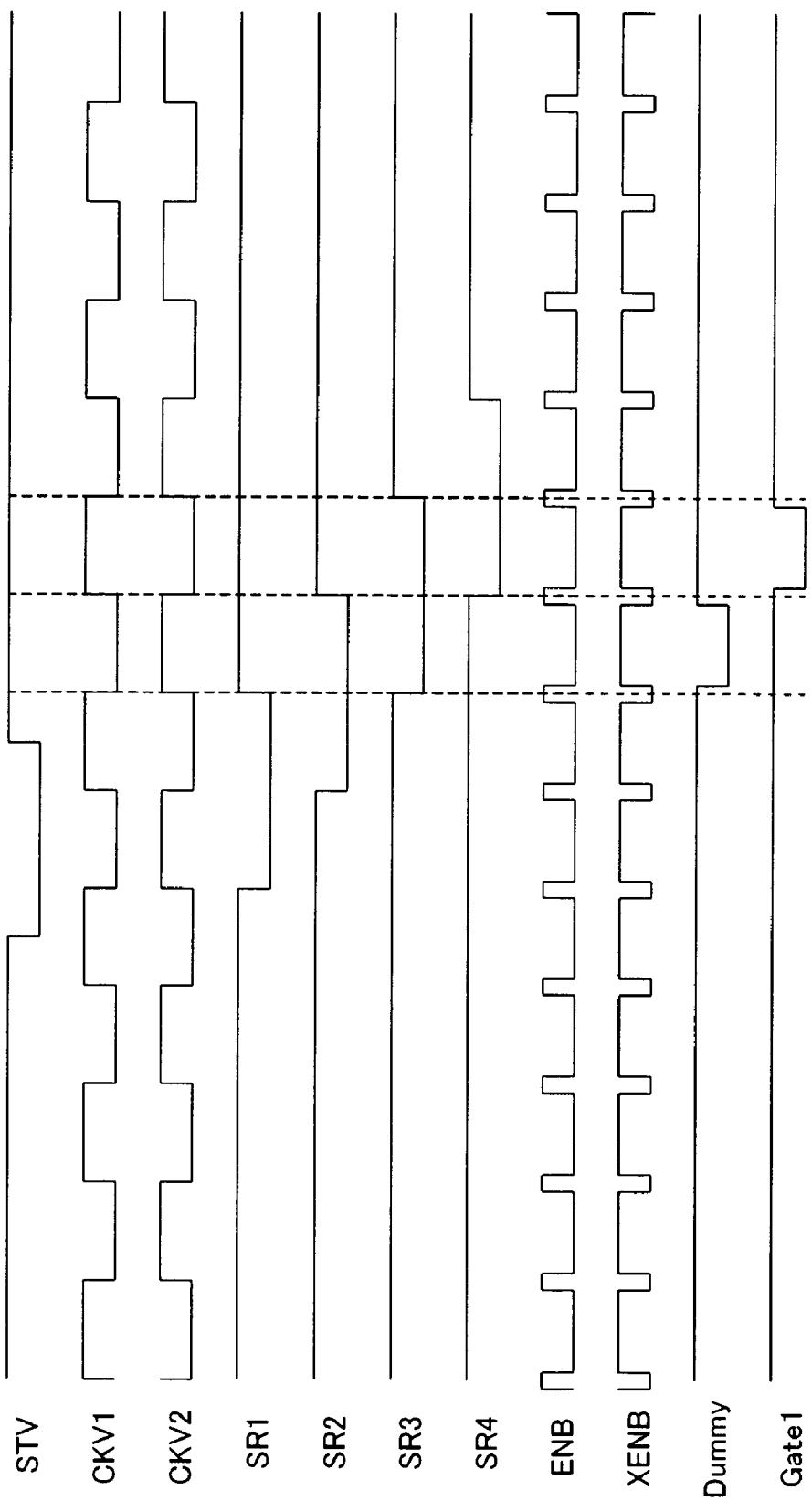
FIG. 10 is a voltage waveform diagram for illustrating operations of the V driver of the liquid crystal display according to the fourth embodiment of the present invention.

Operations of the V driver of the liquid crystal display according to the fourth embodiment are now described with reference to FIGS. 9 and 10.

Figure 8:
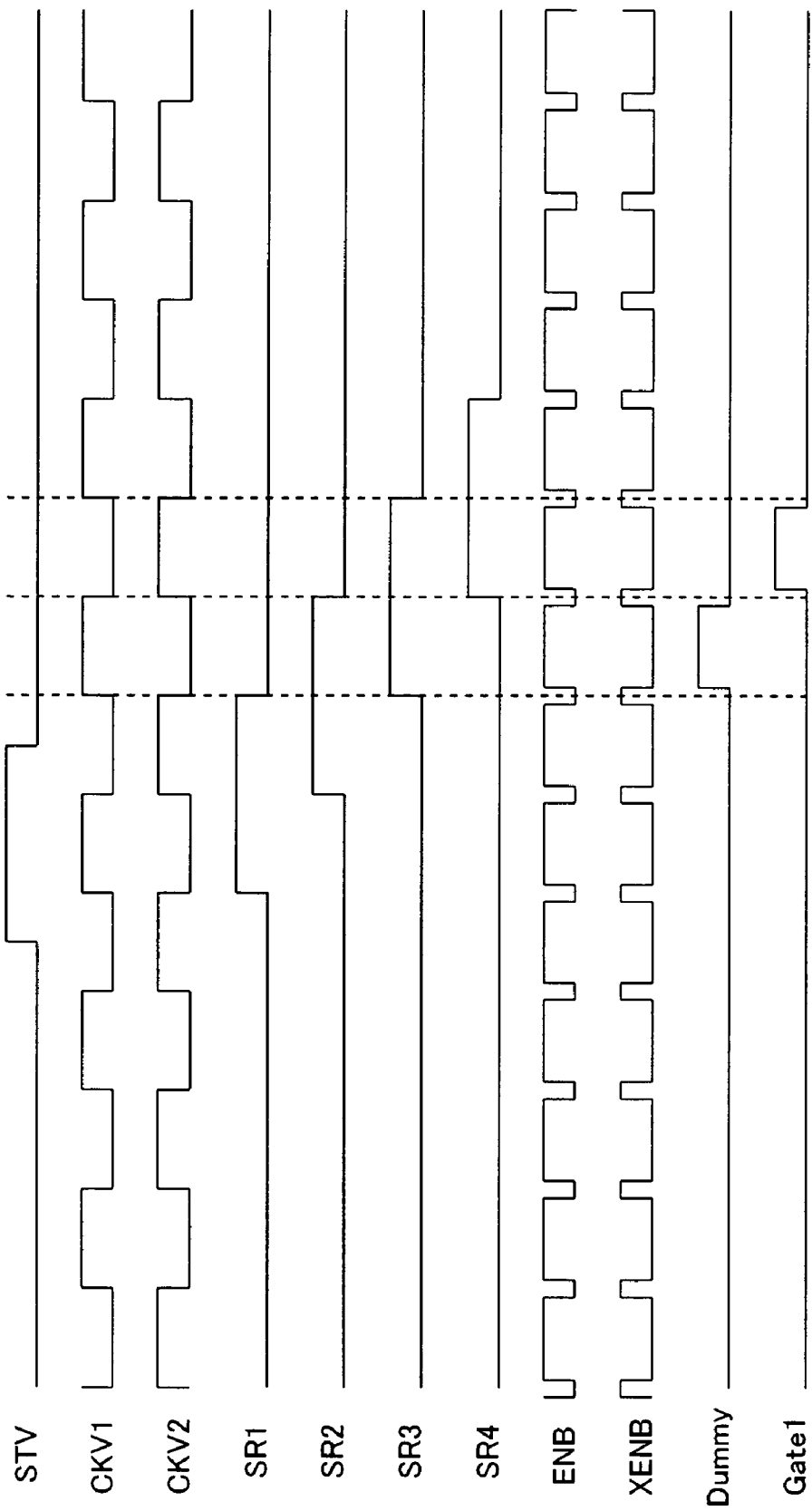
FIG. 8 is a voltage waveform diagram for illustrating operations of the V driver of the liquid crystal display according to the third embodiment of the present invention.

The V driver according to the fourth embodiment inputs signals having waveforms obtained by inverting the high and low levels of the start signal STV, the clock signals CKV1 and CKV2, the enable signal ENB and the inverted enable signal XENB according to the third embodiment shown in FIG. 8 as a start signal STV, clock signals CKV1 and CKV2, an enable signal ENB and an inverted enable signal XENB respectively. Thus, the shift register circuit portions 521 to 525 according to the fourth embodiment output signals having waveforms obtained by inverting the high and low levels of the shift signals SR1 to SR5 from the shift register circuit portions 511 to 515 according to the third embodiment respectively. Further, the logic composition circuit portions 821 to 823 according to the fourth embodiment output signals having waveforms obtained by inverting the high and low levels of the output signals Dummy, Gate1 and Gate2 output from the logic composition circuit portions 811 to 813 according to the third embodiment respectively. The remaining operations of the V driver according to the fourth embodiment are similar to those of the V driver according to the aforementioned third embodiment.

The liquid crystal display according to the fourth embodiment can attain effects such as suppression of increase of current consumption in the V driver similarly to the liquid crystal display according to the aforementioned third embodiment, due to the aforementioned structure.

Fifth Embodiment

Figure 11:
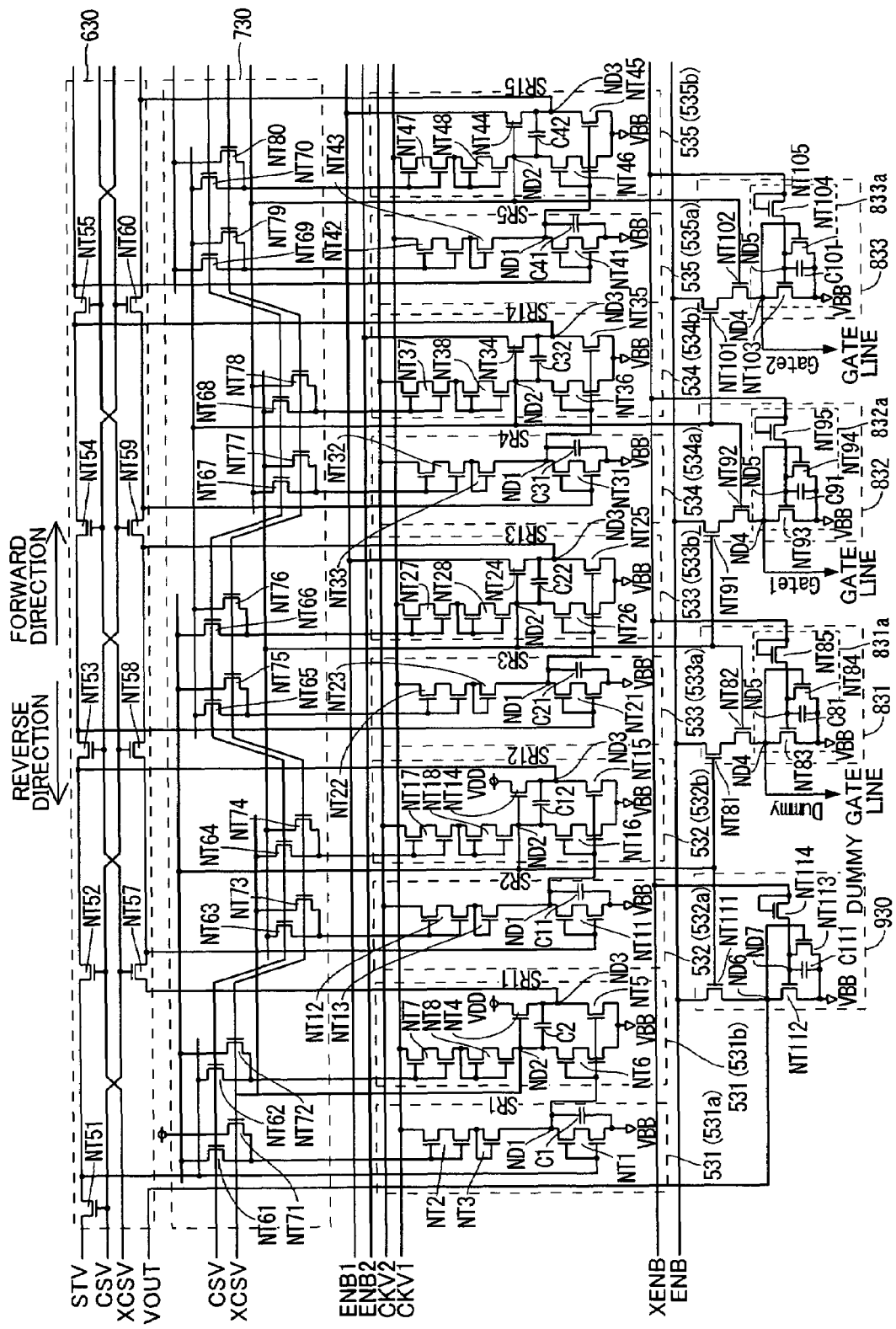
FIG. 11 is a circuit diagram inside a V driver of a liquid crystal display according to a fifth embodiment of the present invention.

Referring to FIG. 11, a liquid crystal display according to a fifth embodiment of the present invention alternately supplies two enable signals different in timing from each other to the drains of transistors connected to nodes of third-stage and subsequent shift register circuit portions outputting shift output signals in a structure similar to that of the liquid crystal display according to the aforementioned third embodiment.

The liquid crystal display according to the fifth embodiment is provided with a plurality of stages of shift register circuit portions 531 to 535, a scanning direction switching circuit portion 630, an input signal switching circuit portion 730, logic composition circuit portions 831 to 833 and a circuit portion 930, as shown in FIG. 11. While FIG. 11 shows only five stages of shift register circuit portions 531 to 535 and three stages of logic composition circuit portions 831 to 833 in order to simplify the illustration, the shift register circuit portions and the logic composition circuit portions are provided in numbers responsive to a pixel number respectively in practice.

The first-stage shift register circuit portion 531 is constituted of first and second circuit portions 531a and 531b having circuit structures similar to those of the first and second circuit portions 51a and 51b of the first-stage shift register circuit portion 51 according to the first embodiment shown in FIG. 2 respectively. The second-stage shift register circuit portion 532 is constituted of first and second circuit portions 532a and 532b having circuit structures similar to those of the first and second circuit portions 52a and 52b of the second-stage shift register circuit portion 52 according to the first embodiment shown in FIG. 2 respectively.

According to the fifth embodiment, enable signal lines supplying enable signals ENB1 and ENB2 respectively are alternately connected to the third- to fifth-stage shift register circuit portions 533 to 535.

More specifically, the third-stage shift register circuit portion 533 is constituted of first and second circuit portions 533a and 533b. The first and second circuit portions 533a and 533b have circuit structures similar to those of the first and second circuit portions 53a and 53b of the third-stage shift register circuit portion 53 according to the first embodiment shown in FIG. 2 respectively. According to the fifth embodiment, an enable signal line (ENB1) is connected to the drain of a transistor NT24.

The fourth-stage shift register circuit portion 534 is constituted of first and second circuit portions 534a and 534b. The first and second circuit portions 534a and 534b have circuit structures similar to those of the first and second circuit portions 54a and 54b of the fourth-stage shift register circuit portion 54 according to the first embodiment shown in FIG. 2 respectively. According to the fifth embodiment, another enable signal line (ENB2) is connected to the drain of a transistor NT34.

The fifth-stage shift register circuit portion 535 is constituted of first and second circuit portions 535a and 535b. The first and second circuit portions 535a and 535b have circuit structures similar to those of the first and second circuit portions 55a and 55b of the fifth-stage shift register circuit portion 55 according to the first embodiment shown in FIG. 2 respectively. According to the fifth embodiment, the enable signal line (ENB1) is connected to the drain of a transistor NT44.

The scanning direction switching circuit portion 630 according to the fifth embodiment includes transistors NT51 to NT55 and NT57 to NT60. In other words, the scanning direction switching circuit portion 630 according to the fifth embodiment has a circuit structure obtained by eliminating the transistor NT56 from that of the scanning direction switching circuit portion 610 according to the third embodiment shown in FIG. 7.

The input signal switching circuit portion 730 according to the fifth embodiment has a circuit structure similar to that of the input signal switching circuit portion 710 according to the third embodiment shown in FIG. 7.

The logic composition circuit portions 831 to 833 according to the fifth embodiment have circuit structures similar to those of the logic composition circuit portions 811 to 813 according to the third embodiment shown in FIG. 7 respectively.

The circuit portion 930 according to the fifth embodiment has a circuit structure similar to that of the circuit portion 910 according to the third embodiment shown in FIG. 7.

Operations of a V driver of the liquid crystal display according to the fifth embodiment are now described with reference to FIGS. 11 and 12.

The operations of the V driver according to the fifth embodiment are basically similar to those of the V driver according to the aforementioned third embodiment. However, the V driver according to the fifth embodiment alternately supplies enable signals ENB1 and ENB2 different in timing from each other to the drains of the transistors NT24, NT34 and NT54 connected to nodes ND3 of the third- to fifth-stage shift register circuit portions 533 to 535 outputting shift output signals SR13 to SR15 respectively, dissimilarly to the aforementioned third embodiment.

More specifically, the liquid crystal display operates on the first- and second-stage shift register circuit portions 531 and 532 (see FIG. 11) similarly to the liquid crystal display according to the third embodiment operating on the first- and second-stage shift register circuit portions 511 and 512 shown in FIG. 7. The second-stage shift register circuit portion 532 inputs a high-level shift signal SR2 (VDD+Vα) in the drain of a transistor NT66. Thus, the source voltage of the transistor NT66 turned on due to a scanning direction switching signal CVS of a voltage VDD supplied in its gate reaches a level (VDD−Vt). Therefore, a transistor NT27 of the third-stage shift register circuit portion 533 receives the voltage (VDD−Vt) in its gate. Further, a transistor NT21 receives a high-level shift output signal SR12 (VDD) in its gate. In addition, a transistor NT22 receives a low-level shift signal SR4 from the fourth-stage shift register circuit portion 534. Thus, the transistors NT21 and NT27 enter ON-states, while the transistor NT22 enters an OFF-state. Therefore, the voltage of a node ND1 supplied with a low-level voltage from the lower voltage VBB through the transistor NT21 goes down to a low level. Thus, transistors NT25 and NT26 enter OFF-states. In this state, a clock signal CKV1 input in the drain of the transistor NT27 goes up from a low level to a high level. Thus, the voltage of a node ND2 of the third-stage shift register circuit portion 533 goes up to a high level, thereby turning on the transistor NT24. At this time, the liquid crystal display holds the source voltage of the transistor NT24 (voltage of the node ND3) at a low level by supplying a low-level enable signal ENB1 to the drain of the transistor NT24.

According to the fifth embodiment, the voltage of the enable signal ENB1 goes up from the low level to a high level. Thus, the voltage of the node ND3 of the third-stage shift register circuit portion 533 goes up to a high level. At this time, the liquid crystal display boots and raises the voltage of the node ND2 of the third-stage shift register circuit portion 533 following rise of the voltage of the node ND3, in order to maintain the gate-to-source voltage of the transistor NT24 through a capacitor C22. Thus, the voltage of the node ND2 of the third-stage shift register circuit portion 533 goes up to a level (VDD+Vβ>VDD+Vt) higher than VDD by a prescribed voltage (Vβ) exceeding the threshold voltage (Vt). The current voltage (VDD+Vβ) of the node ND2 is higher than the raised voltage (VDD+Vα) of the node ND2 in the aforementioned first embodiment. The third-stage shift register circuit portion 533 outputs a high-level shift signal SR3 having the voltage (VDD+Vβ) exceeding VDD+Vt from the node ND2.

A transistor NT68 receives the high-level shift signal SR3 (VDD+Vβ) in its drain. Thus, the source voltage of the transistor NT68 turned on due to a scanning direction switching signal CSV of the voltage VDD input in its gate reaches the level (VDD−Vt). Therefore, a transistor NT37 of the fourth-stage shift register circuit portion 534 receives the voltage (VDD−Vt) in its gate. Further, a transistor NT31 receives a high-level shift output signal SR13 (VDD) in its gate. In addition, a transistor NT32 receives a low-level shift signal SR5 from the fifth-stage shift register circuit portion 535 through a transistor NT67. Thus, the transistors NT31 and NT37 enter ON-states, while the transistor NT32 enters an OFF-state. Therefore, the voltage of the node ND1 supplied with a low-level voltage from the lower voltage VBB through the transistor NT31 goes down to a low level. Thus, the transistors NT35 and NT36 enter OFF-states. Thereafter a clock signal CKV2 input in the drain of the transistor NT37 goes up from a low level to a high level. Thus, the voltage of the node ND2 of the fourth-stage shift register circuit portion 534 goes up to a high level, thereby turning on the transistor NT34. At this time, the liquid crystal display holds the source voltage of the transistor NT34 (voltage of the node ND3) at a low level by supplying a low-level enable signal ENB2 to the drain of the transistor NT34.

According to the fifth embodiment, the voltage of the enable signal ENB2 thereafter goes up from the low level to a high level. Thus, the voltage of the node ND3 of the fourth-stage shift register circuit portion 534 goes up to a high level. At this time, the liquid crystal display boots and raises the voltage of the node ND2 of the fourth-stage shift register circuit portion 534 following rise of the voltage of the node ND3, in order to maintain the gate-to-source voltage of the transistor NT34 through a capacitor C32. Thus, the voltage of the node ND2 of the fourth-stage shift register circuit portion 534 goes up to the level (VDD+Vβ>VDD+Vt) higher than VDD by the prescribed voltage (Vβ) exceeding the threshold voltage (Vt). The fourth-stage shift register circuit portion 534 outputs a high-level shift signal SR4 having the voltage (VDD+Vβ) exceeding VDD+Vt from the node ND2.

Also on the fifth-stage shift register circuit portion 535 and subsequent shift register circuit portions, the liquid crystal display performs operations similar to those on the aforementioned third- and fourth-stage shift register circuit portions 533 and 534. In other words, the liquid crystal display raises the voltage of the node ND2 to the high level (VDD+Vβ>VDD+Vt) by raising the clock signal CKV1 to a high level and thereafter raising the enable signal ENB1 to a high level in the fifth-stage shift register circuit portion 535. In the shift register circuit portion subsequent to the fifth-stage shift register circuit portion 535, the liquid crystal display raises the clock signal CKV2 to a high level for raising the voltage of a node ND2 and thereafter raises the enable signal ENB2 to a high level thereby further raising the voltage of the node ND2 to the high level (VDD+Vβ>VDD+Vt). The liquid crystal display alternately performs these operations in the respective shift register circuit portions. Thus, the liquid crystal display sequentially raises the voltages of shift signals output from the shift register circuit portions to the high level (VDD+Vβ>VDD+Vt).

The remaining operations of the V driver according to the fifth embodiment are similar to those of the V drive according to the aforementioned third embodiment.

According to the fifth embodiment, as hereinabove described, the liquid crystal display, capable of further raising the gate voltage (VDD+Vβ>VDD+Vt) of the transistor NT24 as compared with a case of connecting the drain of the transistor NT24 to the fixed higher voltage VDD in the third-stage shift register circuit portion 533, for example, similarly to the third-stage shift register circuit portion 513 according to the aforementioned third embodiment by alternately supplying the enable signals ENB1 and ENB2 different in timing from each other to the drains of the transistors NT24, NT34 and NT54 connected to the nodes ND3 of the third- to fifth-stage shift register circuit portions 533 to 535 outputting the shift output signals SR13 to SR15 respectively, can more reliably hold the transistor NT24 in an ON-state.

According to the fifth embodiment, the liquid crystal display employing the two enable signals ENB1 and ENB2 different in timing from each other can fluctuate the source voltages of the transistors NT24 and NT34 from VBB to VDD coincidently with the timing for turning on the transistors NT24 and NT34 of the shift register circuit portions 533 and 534 in response to the clock signals CKV1 and CKV2 respectively in the adjacent shift register circuit portions 533 and 534, for example. Further, the liquid crystal display can hold the source voltage sources of the transistors NT24 and NT34 at VDD until immediately before the transistors NT24 and NT34 of the shift register circuit portions 533 and 534 enter OFF-states in response to the clock signals CKV1 and CKV2 respectively. Thus, the liquid crystal display can suppress such inconvenience that the gate voltages of the transistors NT24 and NT34 fluctuate due to the source voltages of the transistors NT24 and NT34 reaching VBB immediately before the transistors NT24 and NT34 are turned off in response to the clock signals CKV1 and CKV2 respectively. In this case, the liquid crystal display can inhibit the transistor NT37 (NT47) from instable operations when inputting the gate voltage of the transistor NT24 (NT34) in the transistor NT37 (NT47) of the subsequent shift register circuit portion 534 (535). Further, the liquid crystal display capable of suppressing delay of the timing for turning on the transistor NT37 (NT47) resulting from instable operations of the transistor NT37 (NT47) can suppress delay of the timing for inputting the clock signal in the transistor NT34 (NT44) through the transistor NT37 (NT47).

According to the fifth embodiment, as hereinabove described, the liquid crystal display alternately supplying the clock signals CKV1 and CKV2 to the gates of the transistors NT24, NT34 and NT44 while alternately supplying the enable signals ENB1 and ENB2 different in timing from each other to the drains thereof in the shift register circuit portions 533 to 535 can raise the source voltage of the transistor NT24 from a low level (VBB) to a high level (VDD) through the enable signal ENB1 after turning on the transistor NT24 following an operation of raising the gate voltage of the transistor NT24 from the low level (VBB) to the high level (VDD) through the clock signal CKV1 in the third-stage shift register circuit portion 533, for example. Thus, the liquid crystal display can raise the gate voltage of the transistor NT24 by the current rise (Vβ) of the source voltage of the transistor NT24. Further, the liquid crystal display can raise the source voltage of the transistor NT34 from the low level (VBB) to the high level (VDD) through the enable signal ENB2 after turning on the transistor NT34 following an operation of raising the gate voltage of the transistor NT34 from the low level (VBB) to the high level (VDD) through the clock signal CKV2 in the fourth-stage shift register circuit portion 534. Thus, the liquid crystal display can raise the gate voltage of the transistor NT34 by the current rise (Vβ) of the source voltage of the transistor NT34. Thus, the liquid crystal display, capable of further raising the voltages (VDD+Vβ>VDD+Vt) of the shift signals SR3 and SR4 as compared with a case of connecting the drains of the transistors NT24 and NT34 to the fixed higher voltage supply voltage VDD, can more easily raise the voltages of the shift signals SR3 and SR4 to the level higher than VDD by at least the threshold voltage (Vt). Therefore, the liquid crystal display can more easily supply the shift signals SR3 and SR4 having the voltages exceeding VDD+Vt to the gates of the transistors NT91 and NT92 of the logic composition circuit portion 832 linked with the first-stage gate line respectively. Thus, the liquid crystal display can further suppress reduction of the voltage of the shift output signal Gate1 output to the first-stage gate line through the transistors NT91 and NT92 of the logic composition circuit portion 832 by the threshold voltage (Vt).

According to the fifth embodiment, the liquid crystal display employing the two enable signals ENB1 and ENB2 different in timing from each other can raise the source voltages of the transistors NT27 and NT37 from the low levels (VBB) to the high levels (VDD) coincidently with the timing for turning on the transistors NT27 and NT37 of the third- and fourth-stage shift register circuit portions 533 and 534 respectively, for example. Further, the liquid crystal display can hold the source voltages of the transistors NT27 and NT37 at the high levels until the transistors NT27 and NT37 of the shift register circuit portions 533 and 534 enter OFF-states respectively. Thus, the liquid crystal display can suppress such inconvenience that the gate voltages of the transistors NT27 and NT37 go down due to reduction of the source voltages of the transistors NT27 and NT37 to the low levels (VBB) before the transistors NT27 and NT37 enter OFF-states respectively. In this case, the liquid crystal display can inhibit the voltages of the shift signals SR3 and SR4 output from the nodes ND2 of the third- and fourth-stage shift register circuit portions 533 and 534 respectively from reduction. Thus, the liquid crystal display can inhibit the transistors NT91 and NT92 of the logic composition circuit portions 832 and 833 receiving the shift signals SR3 and SR4 in the gates thereof respectively from instable operations.

The remaining effects of the fifth embodiment are similar to those of the aforementioned third embodiment.

Sixth Embodiment

Figure 13:
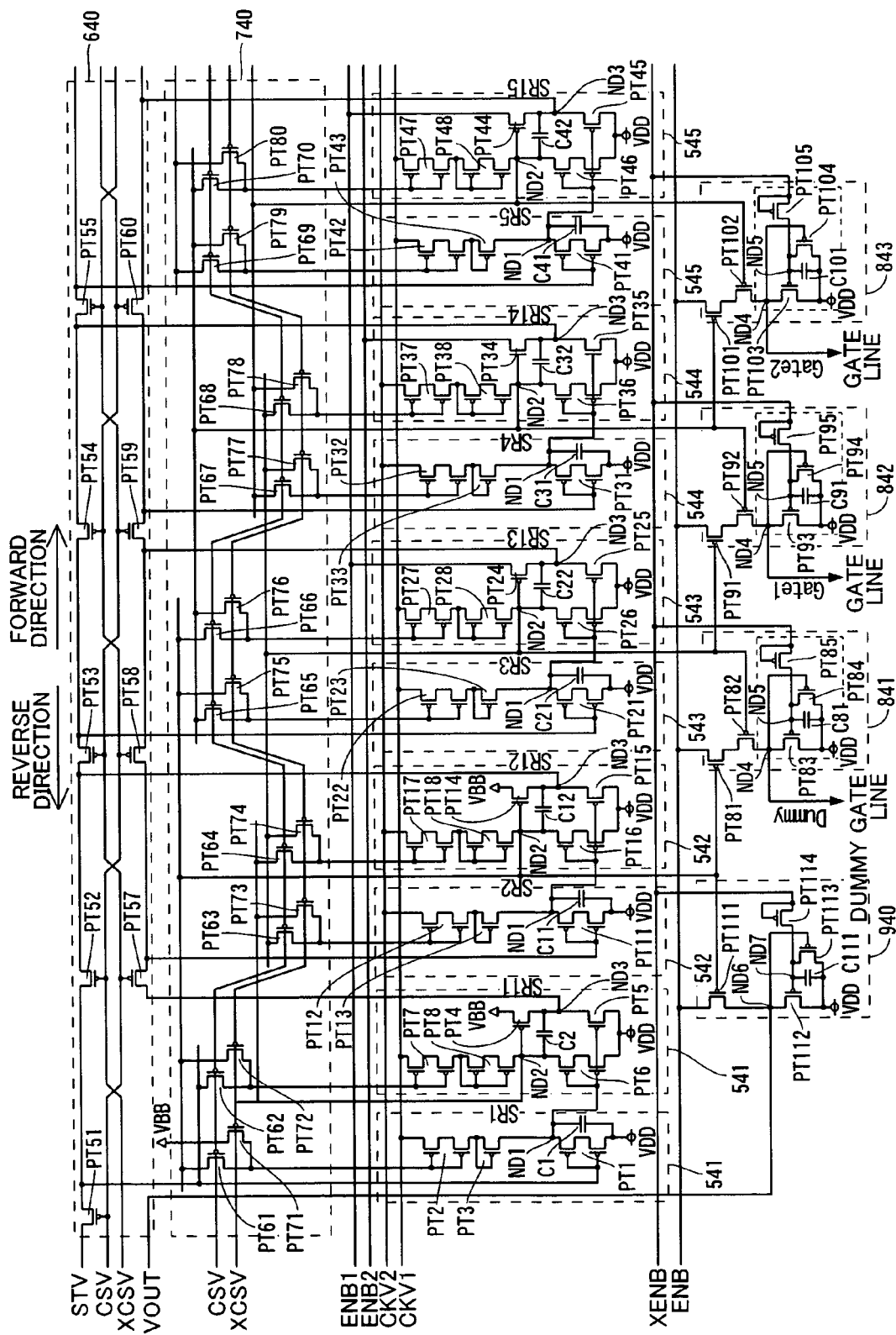
FIG. 13 is a circuit diagram inside a V driver of a liquid crystal display according to a sixth embodiment of the present invention.

Referring to FIG. 13, a V driver similar to that according to the aforementioned fifth embodiment is constituted of p-channel transistors in a liquid crystal display according to a sixth embodiment of the present invention.

The structure of the V driver according to the sixth embodiment is substantially similar to that of the V driver according to the aforementioned fifth embodiment, as shown in FIG. 13. In the V driver according to the sixth embodiment, a plurality of stages of shift register circuit portions 541 to 545, a scanning direction switching circuit portion 640, an input signal switching circuit portion 740, a plurality of stages of logic composition circuit portions 841 to 843 and a circuit portion 940 are constituted of p-channel transistors (PT1 to PT8, PT11 to PT18, PT21 to PT28, PT31 to PT38, PT41 to PT48, PT51 to PT60, PT61 to PT80, PT81 to PT85, PT91 to PT95, PT101 to PT105 and PT111 to PT114), dissimilarly to the fifth embodiment. While FIG. 13 shows only five stages of shift register circuit portions 541 and three stages of logic composition circuit portions 841 to 843 in order to simplify the illustration, the shift register circuit portions and the logic composition circuit portions are provided in numbers responsive to a pixel number respectively in practice.

Figure 14:
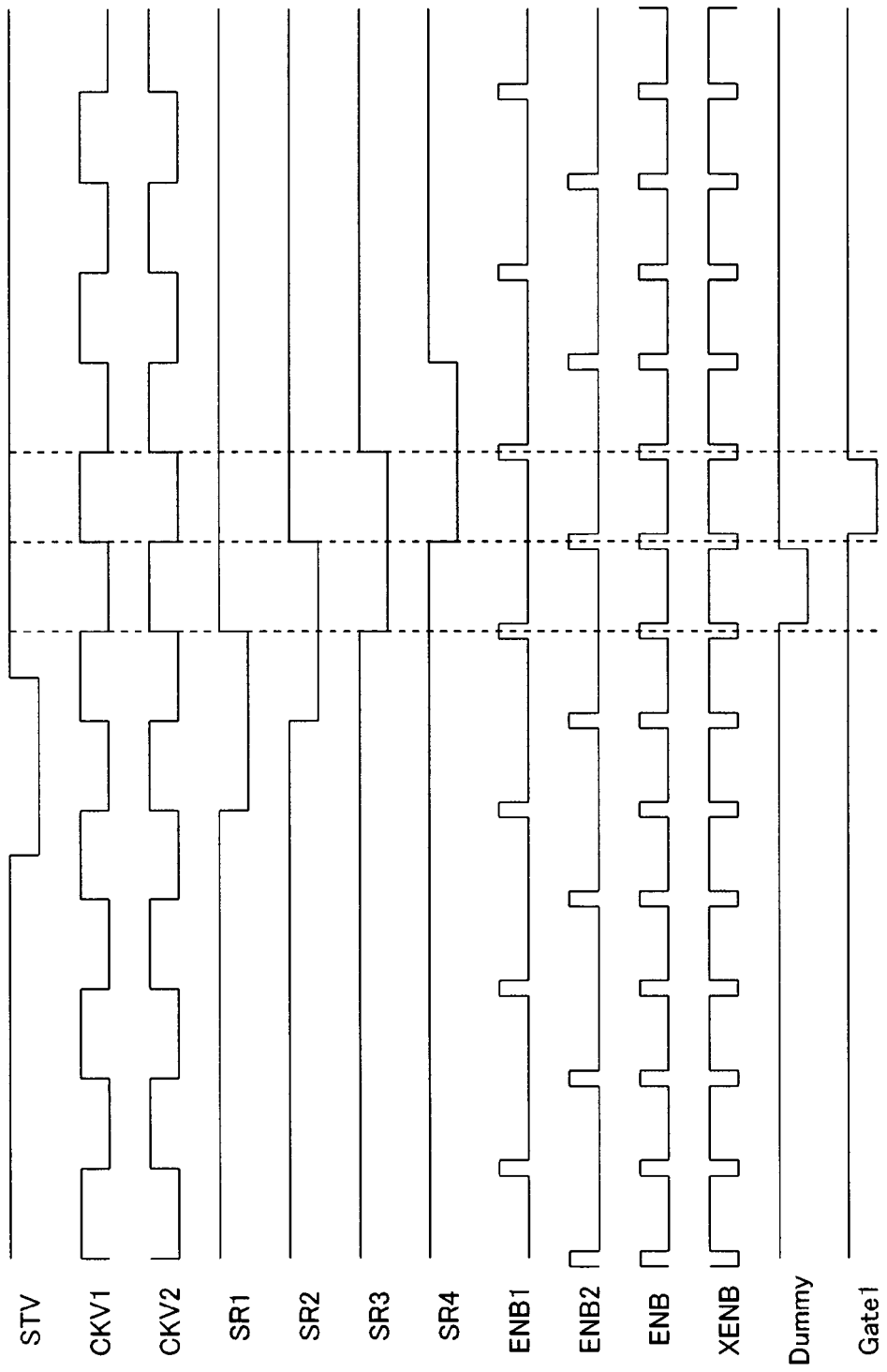
FIG. 14 is a voltage waveform diagram for illustrating operations of the V driver of the liquid crystal display according to the sixth embodiment of the present invention.

Operations of the V driver of the liquid crystal display according to the sixth embodiment are now described with reference to FIGS. 13 and 14.

Figure 12:
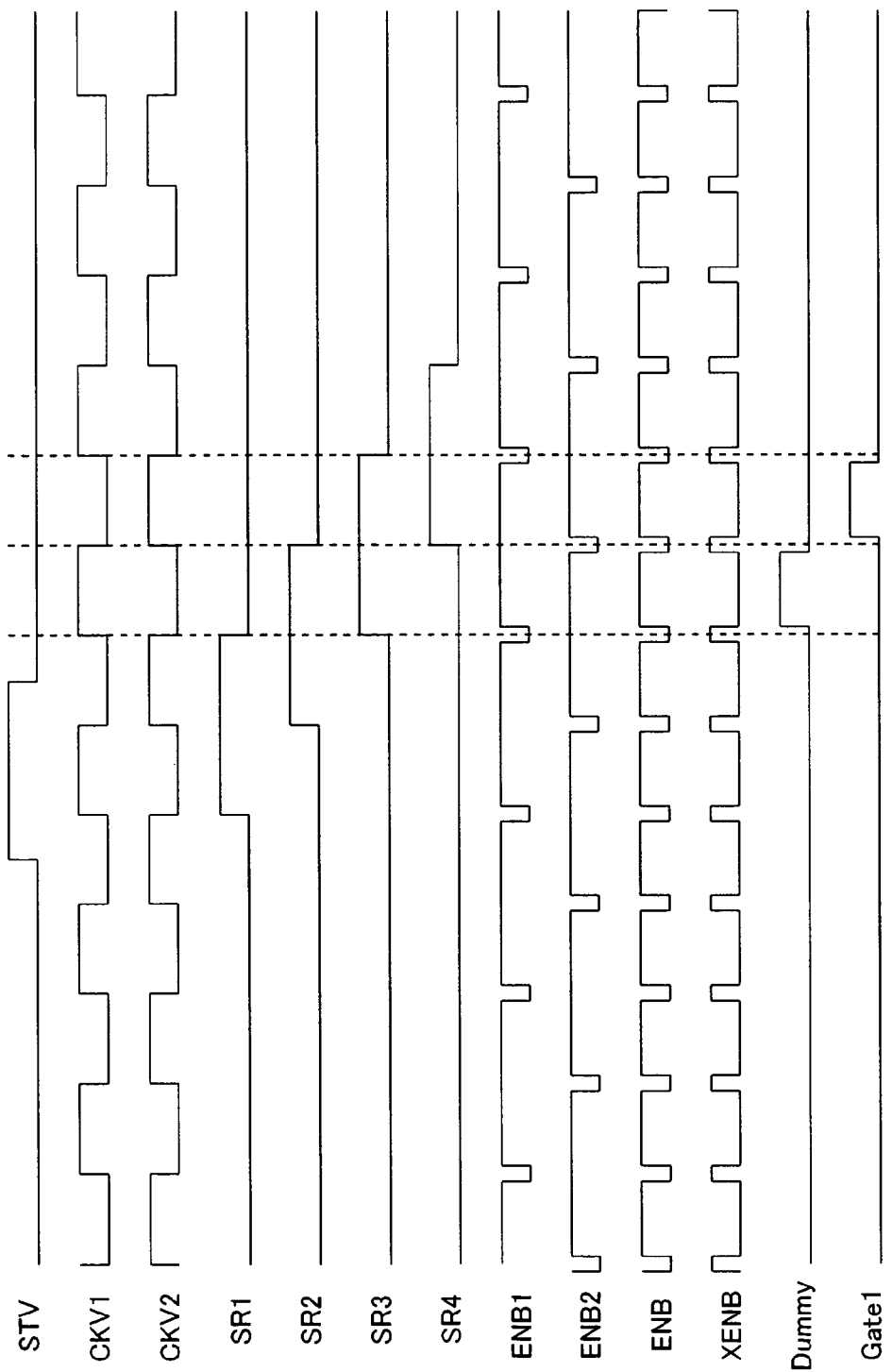
FIG. 12 is a voltage waveform diagram for illustrating operations of the V driver of the liquid crystal display according to the fourth embodiment of the present invention.

The V driver according to the sixth embodiment inputs signals having waveforms obtained by inverting the high and low levels of a start signal STV, the clock signals CKV1 and CKV2, the enable signals ENB, ENB1 and ENB2 and an inverted enable signal XENB according to the fifth embodiment shown in FIG. 12 as a start signal STV, clock signals CKV1 and CKV2, enable signals ENB, ENB1 and ENB2 and an inverted enable signal XENB respectively. Thus, the shift register circuit portions 541 to 545 according to the sixth embodiment output signals having waveforms obtained by inverting the high and low levels of the shift signals SR1 to SR5 from the shift register circuit portions 531 to 535 according to the fifth embodiment respectively. Further, the logic composition circuit portions 841 to 843 according to the sixth embodiment output signals having waveforms obtained by inverting the high and low levels of the output signals Dummy, Gate1 and Gate2 output from the logic composition circuit portions 831 to 833 according to the fifth embodiment respectively. The remaining operations of the V driver according to the sixth embodiment are similar to those of the V driver according to the aforementioned fifth embodiment.

The liquid crystal display according to the sixth embodiment can attain effects such as suppression of increase of current consumption in the V driver similarly to the aforementioned fifth embodiment, due to the aforementioned structure.

Seventh Embodiment

Figure 15:
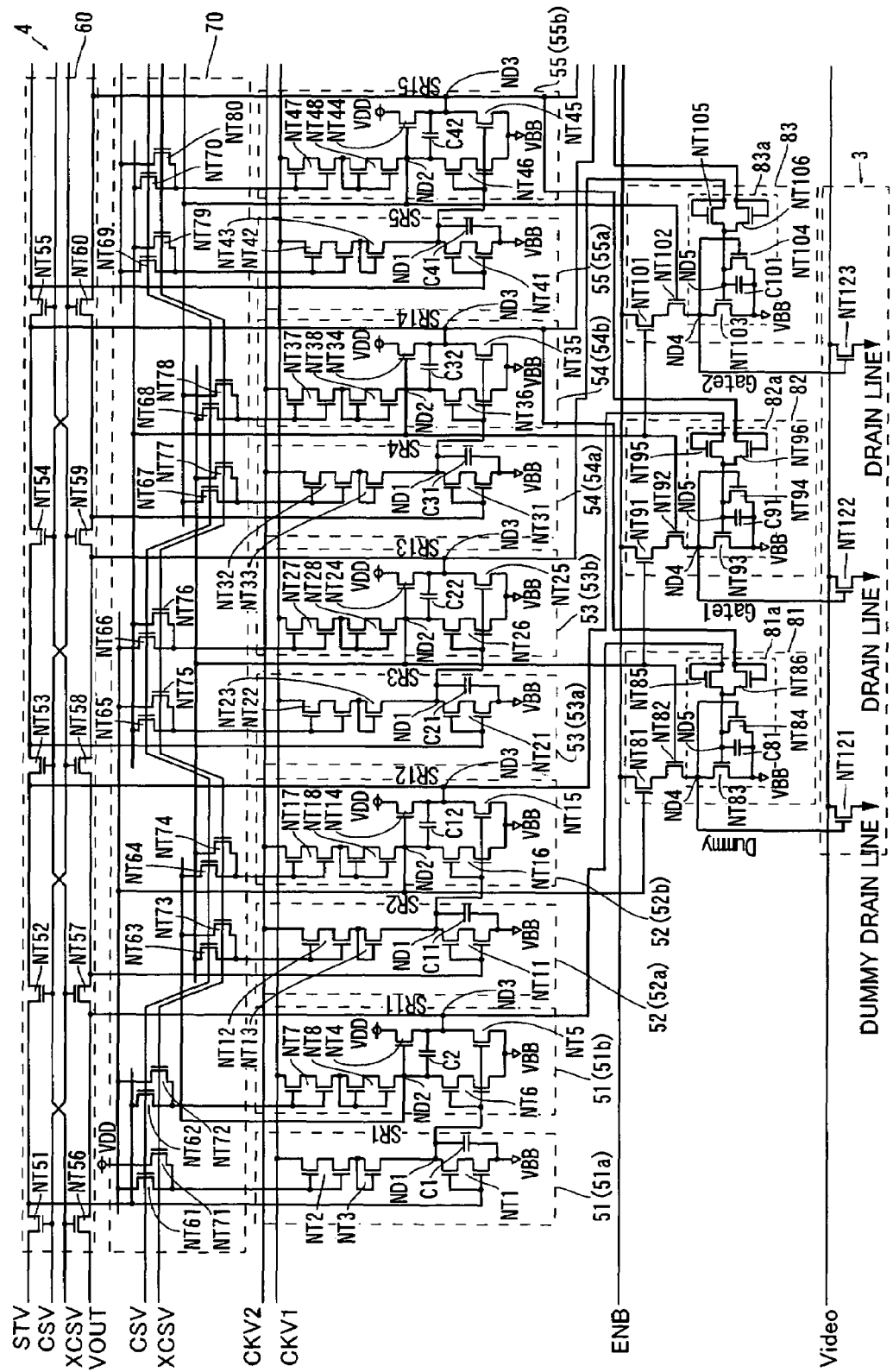
FIG. 15 is a circuit diagram inside horizontal switches and an H driver of a liquid crystal display according to a seventh embodiment of the present invention.

Referring to FIG. 15, the present invention is applied to an H driver 4 for driving (scanning) drain lines in a liquid crystal display according to a seventh embodiment of the present invention, in a structure similar to that of the liquid crystal display according to the first embodiment shown in FIG. 1.

The H driver 4 of the liquid crystal display according to the seventh embodiment is provided therein with a plurality of stages of shift register circuit portions 51 to 55, a scanning direction switching circuit portion 60, an input signal switching circuit portion 70 and a plurality of stages of logic composition circuit portions 81 to 83 as shown in FIG. 15, similarly to the V driver 5 according to the first embodiment shown in FIG. 2. While FIG. 15 shows only five stages of shift register circuit portions 51 to 55 and three stages of logic composition circuit portions 81 to 83 in order to simplify the illustration, the shift register circuit portions and the logic composition circuit portions are provided in numbers corresponding to a pixel number in practice respectively. According to the seventh embodiment, the logic composition circuit portions 81 to 83 are connected with horizontal switches 3.

More specifically, the horizontal switches 3 include n-channel transistors 121 to 123 of a number responsive to the number of the stages of the logic composition circuit portions 81 to 83. The n-channel transistors NT121 to NT123 are hereinafter referred to as transistors NT121 to NT123 respectively.

The source and the drain of the transistor NT121 are connected to a dummy drain line and a video signal line (Video) respectively. The gate of this transistor NT121 is connected to a node ND4 of the logic composition circuit portion 81. The source and the drain of the transistor NT122 are connected to a first-stage drain line and the video signal line (Video) respectively. The gate of this transistor NT122 is connected to a node ND4 of the logic composition circuit portion 82. The source and the drain of the transistor NT123 are connected to a second-stage drain line and the video signal line (Video) respectively. The gate of this transistor NT123 is connected to a node ND4 of the logic composition circuit portion 83.

Operations of the horizontal switches 3 and the H driver 4 of the liquid crystal display according to the seventh embodiment are now described with reference to FIG. 15. The H driver 4 according to the seventh embodiment sequentially inputs high-level output signals sequentially output from the logic composition circuit portions 81 to 83 in the gates of the corresponding transistors NT121 to NT123 of the horizontal switches 3 respectively. Thus, the transistors NT121 to NT123 of the horizontal switches 3 sequentially enter ON-states. Therefore, the liquid crystal display sequentially outputs a video signal from the video signal line (Video) to the drain lines through the transistors NT121 to NT123 of the horizontal switches 3. The remaining operations of the H driver 4 according to the seventh embodiment are similar to those of the V driver 5 according to the aforementioned first embodiment.

The liquid crystal display according to the seventh embodiment can attain effects such as suppression of increase of current consumption in the H driver 4, due to the aforementioned structure.

Eighth Embodiment

Figure 16:
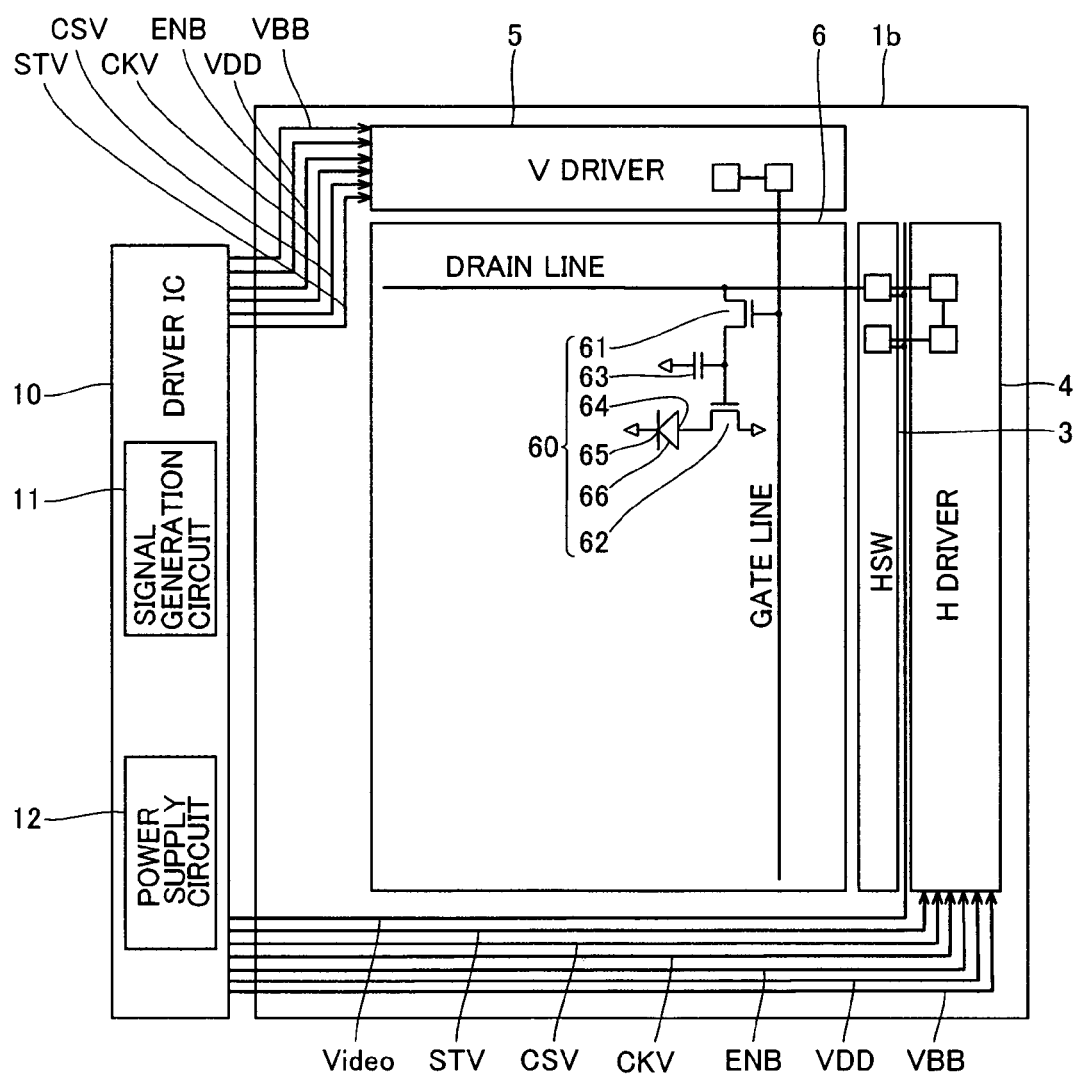
FIG. 16 is a plan view showing an organic EL display according to an eighth embodiment of the present invention.

Referring to FIG. 16, the present invention is applied to an organic EL display including pixels having n-channel transistors according to an eighth embodiment of the present invention.

According to the eighth embodiment, a display portion 6 is formed on a substrate 1b, as shown in FIG. 16. Pixels 60 each including n-channel transistors 61 and 62 (hereinafter referred to as transistors 61 and 62 respectively), a subsidiary capacitor 63, an anode 64, a cathode 65 and an organic EL cell 66 held between the anode 64 and the cathode 65 are arranged on the display portion 6 in the form of a matrix. FIG. 16 shows the structure of only one pixel 60 on the display portion 6. The source of the transistor 61 is connected to the gate of the transistor 62 and a first electrode of the subsidiary capacitor 63, while the drain thereof is connected to a drain line. The gate of this transistor 61 is connected to a gate line. The source and the drain of the transistor 62 are connected to the anode 64 and a current supply line (not shown) respectively.

The remaining structure of the organic El display according to the eighth embodiment is similar to that of the liquid crystal display according to the first embodiment shown in FIG. 1.

According to the eighth embodiment, the organic EL display can attain effects such as suppression of increase of power consumption in the V driver 5 similarly to the aforementioned first embodiment, due to the aforementioned structure. Further, the organic EL display can suppress increase of power consumption in the V driver 5 also when performing bidirectional scanning.

Ninth Embodiment

Figure 17:
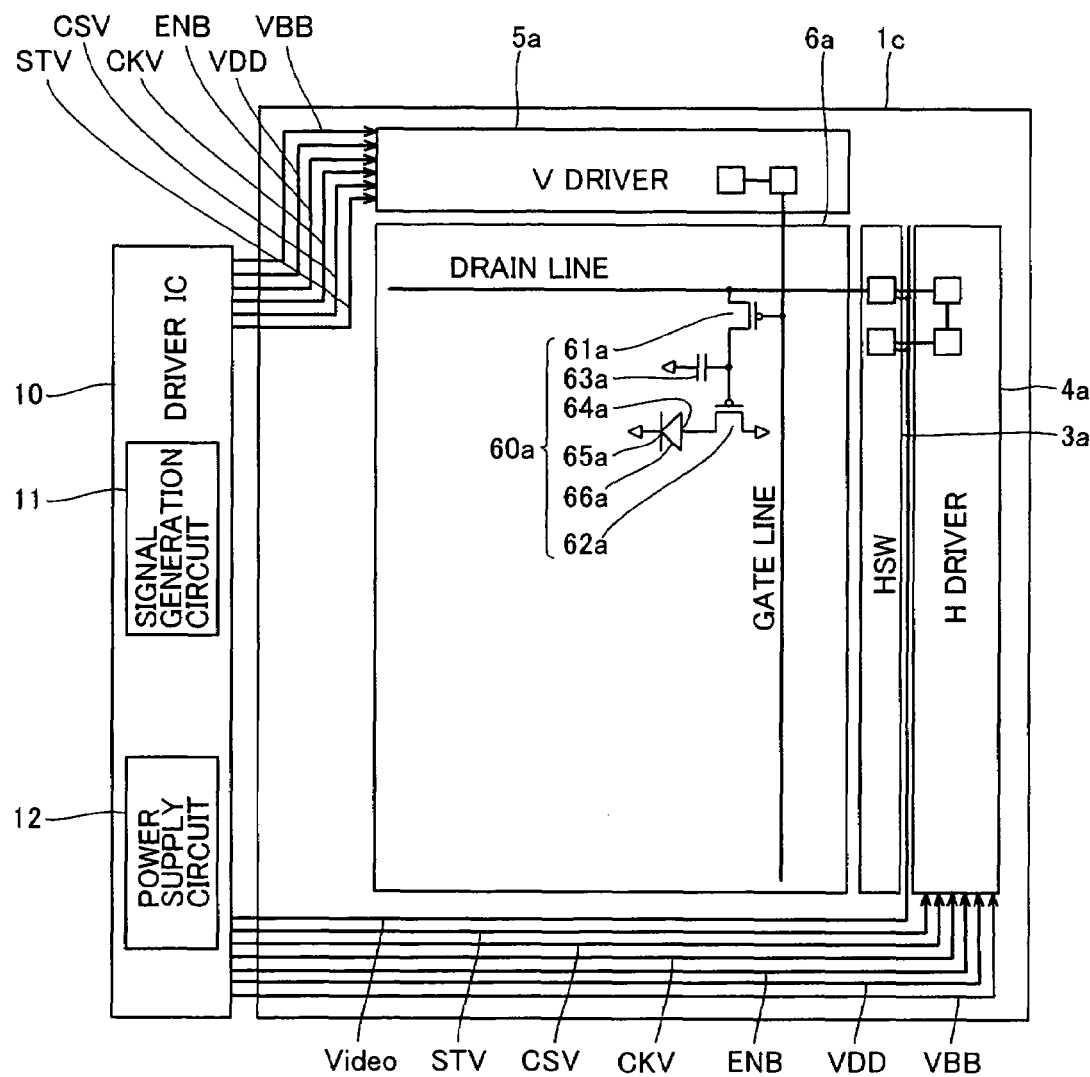
FIG. 17 is a plan view showing an organic EL display according to a ninth embodiment of the present invention.
Figure 18:
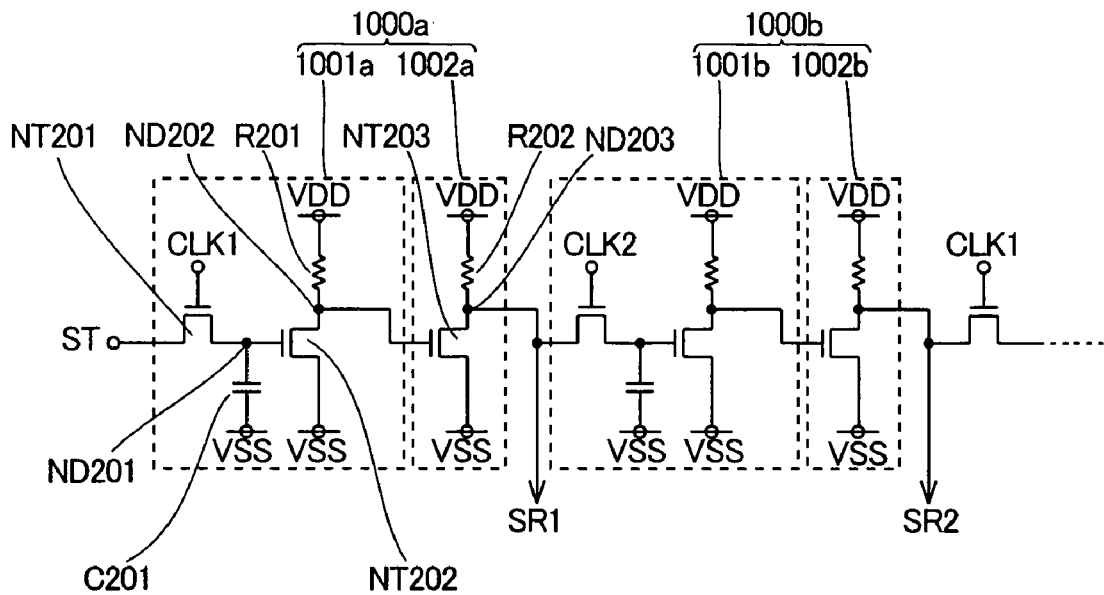
FIG. 18 is a circuit diagram of conventional shift register circuits including resistance load inverter circuits.
Figure 19:
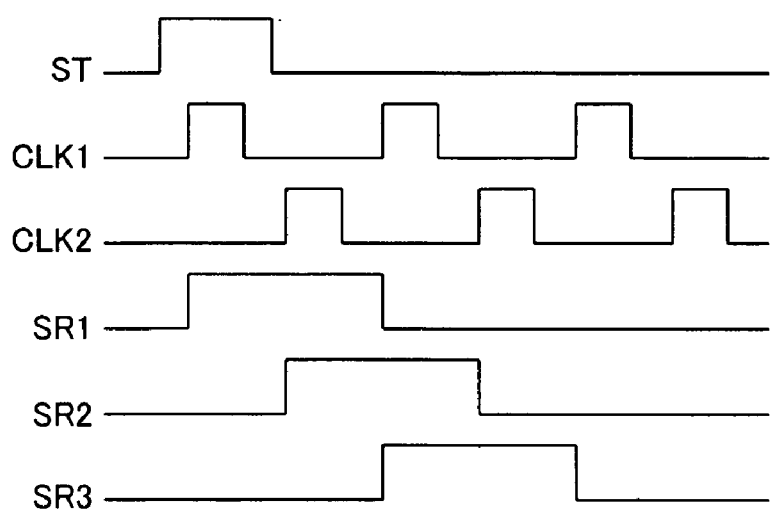
FIG. 19 is a waveform diagram for illustrating operations of the conventional shift register circuits shown in FIG. 18.

Referring to FIG. 17, the present invention is applied to an organic EL display including pixels having p-channel transistors in a ninth embodiment of the present invention.

According to the ninth embodiment, a display portion 6a is formed on a substrate 1c, as shown in FIG. 17. Pixels 60a each including p-channel transistors 61a and 62a (hereinafter referred to as transistors 61a and 62a respectively), a subsidiary capacitor 63a, an anode 64a, a cathode 65a and an organic EL cell 66a held between the anode 64a and the cathode 65a are arranged on the substrate 1c in the form of a matrix, as shown in FIG. 17. FIG. 17 shows the structure of only one pixel 60a on the display portion 6a. The source of the transistor 61a is connected to a drain line, and the drain thereof is connected to the gate of the transistor 62a and a first electrode of the subsidiary capacitor 63a. The gate of this transistor 61a is connected to a gate line. The source and the drain of the transistor 62a are connected to a current supply line (not shown) and the anode 64a respectively.

The remaining structure of the organic EL display according to the ninth embodiment is similar to that of the liquid crystal display according to the second embodiment shown in FIG. 4.

According to the ninth embodiment, the organic EL display can attain effects such as suppression of increase of power consumption in the V driver 5a similarly to the aforementioned second embodiment, due to the aforementioned structure. Further, the organic EL display can suppress increase of power consumption in the V driver 5a also when performing bidirectional scanning.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the liquid crystal display or the organic EL display in each of the aforementioned first to ninth embodiments, the present invention is not restricted to this but is also applicable to a display other than the liquid crystal display and the organic EL display.

While the present invention is applied to only either the H driver or the V driver in each of the aforementioned first to ninth embodiments, the present invention is not restricted to this but may alternatively be applied to both of the H driver and the V driver. In this case, it is possible to further suppress increase of power consumption.

While the display according to each of the aforementioned first to ninth embodiments employs the shift signals subsequent and precedent to the prescribed shift register circuit portion relative to the scanning direction as the first and second signals respectively, the present invention is not restricted to this but the display may alternatively employ signals other than the shift signals as the first and second signals unless the first and second signals simultaneously reach voltages capable of turning on the transistors.

While all of the transistors employed for the H driver according to the present invention are constituted of n-channel transistors in the aforementioned seventh embodiment, the present invention is not restricted to this but all of the transistors employed for the H driver according to the present invention may alternatively be constituted of p-channel transistors.

Further, all capacitors may be constituted of n-channel transistors in the first, third, fifth, seventh and eighth embodiments employing n-channel transistors. Further, all capacitors may be constituted of p-channel transistors in the second, fourth, sixth and ninth embodiments employing p-channel transistors.

What is claimed is:

1. A display comprising a shift register circuit including:
a shift register circuit portion including a first circuit portion having a first transistor connected to a first voltage and a second transistor connected to a clock signal line and turned on in response to a first signal and a second circuit portion having a third transistor turned on in response to a clock signal, a fourth transistor connected to said first voltage, a fifth transistor connected between the gate of said third transistor and said first voltage and a sixth transistor connected between the gate of said third transistor and said clock signal line and turned on in response to a second signal providing an ON-state period not overlapping with an ON-state period of said second transistor receiving said first signal thereby supplying said clock signal to the gate of said third transistor;

a scanning direction switching circuit portion for switching a scanning direction; and an input signal switching circuit portion for switching said first signal and said second signal supplied to the gate of said second transistor and the gate of said sixth transistor respectively in response to said scanning direction.

2. The display according to claim 1, provided with a plurality of stages of said shift register circuit portions, wherein said first signal is a shift signal from said shift register circuit portion subsequent to a prescribed stage relative to said scanning direction, and said second signal is a shift signal from said shift register circuit portion precedent to said prescribed stage relative to said scanning direction.

3. The display according to claim 1, wherein a capacitor is connected between the gate and the source of said third transistor, and said first signal and said second signal are the gate voltage of said third transistor.

4. The display according to claim 3, wherein the drain of said third transistor is connected to a second voltage.

5. The display according to claim 3, wherein the drain of said third transistor is connected to a periodic signal line supplying a periodic signal periodically switching between a first voltage and a second voltage.

6. The display according to claim 5, provided with a plurality of stages of said shift register circuit portions, wherein said periodic signal line includes a first periodic signal line and a second periodic signal line, and said first periodic signal line and said second periodic signal line are alternately connected to the drain of said third transistor every stage.

7. The display according to claim 1, wherein said input signal switching circuit portion includes a seventh transistor and an eighth transistor connected to the gate of said second transistor as well as a ninth transistor and a tenth transistor connected to the gate of said sixth transistor, the display supplying said first signal to the gate of said second transistor by turning on said seventh transistor and supplying said second signal to the gate of said sixth transistor by turning on said tenth transistor when scanning in a first direction, and supplying said first signal to the gate of said second transistor by turning on said eighth transistor and supplying said second signal to the gate of said sixth transistor by turning on said ninth transistor when scanning in a second direction opposite to said first direction.

8. The display according to claim 1, wherein said first transistor enters an OFF-state in an ON-state period of said second transistor turned on in response to said first signal, and said fifth transistor enters an OFF-state in an ON-state period of said sixth transistor turned on in response to said second signal.

9. The display according to claim 1, wherein said fifth transistor has a function of turning off said third transistor when said fourth transistor is in an ON-state.

10. The display according to claim 1, wherein at least said first transistor, said second transistor, said third transistor, said fourth transistor, said fifth transistor and said sixth transistor are transistors of the same conductive type.

11. The display according to claim 1, wherein at least one of said first transistor, said second transistor, said fifth transistor and said sixth transistor has two gate electrodes electrically connected with each other.

12. The display according to claim 1, wherein a first diode is connected between the gate of said fifth transistor and said second transistor, and a second diode is connected between the gate of said third transistor and said sixth transistor.

13. The display according to claim 12, wherein said first diode includes a diode-connected eleventh transistor, and said second diode includes a diode-connected twelfth transistor, and said eleventh transistor and said twelfth transistor are transistors of the same conductive type as said first transistor, said second transistor, said third transistor, said fourth transistor, said fifth transistor and said sixth transistor.

14. The display according to claim 1, wherein said shift register circuit is applied to at least either a shift register circuit for driving a gate line or a shift register circuit for driving a drain line.

15. A display comprising a shift register circuit including:

a first shift register circuit portion constituted of a first conductive type transistor for outputting a first shift signal;

a second shift register circuit portion constituted of a first conductive type transistor for outputting a second shift signal and arranged subsequently to said first shift register circuit portion;

a third shift register circuit portion constituted of a first conductive type transistor for outputting a third shift signal and arranged subsequently to said second shift register circuit portion;

a first logic composition circuit portion outputting a first shift output signal by logically compositing said first shift signal and said second shift signal with each other a second logic composition circuit portion outputting a second shift output signal by logically compositing said second shift signal and said third shift signal with each other; and timing for dropping a first shift output signal from a high level to a low level or timing for raising said first shift output signal from a low level to a high level and timing for raising a second shift output signal from a low level to a high level or timing for dropping said second shift output signal from a high level to a low level do not overlap with each other.

16. The display according to claim 15, wherein said logic composition circuit portion includes:

a first conductive type first transistor having either a source or a drain connected to a first signal line supplying a first signal switching between a first voltage and a second voltage and a gate receiving said first shift signal, and a first conductive type second transistor having either a source or a drain connected to either said drain or said source of said first transistor and a gate receiving said second shift signal, the display outputting said shift output signal of said first voltage through said first transistor and said second transistor by turning on said first transistor and said second transistor and supplying said first signal of said first voltage from said first signal line to either said source or said drain of said first transistor when said first shift signal and said second shift signal are at said first voltage, and outputting said shift output signal of said second voltage through said first transistor and said second transistor by supplying said first signal of said second voltage from said first signal line to either said source or said drain of said first transistor when said first shift signal changes from said first voltage to said second voltage.

17. The display according to claim 16, forcibly holding said shift output signal at said second voltage while said first signal is at said second voltage.

18. The display according to claim 16, wherein
said logic composition circuit portion includes a voltage fixing circuit portion for fixing said shift output signal to said second voltage after said first shift signal changes from said first voltage to said second voltage.

19. The display according to claim 18, wherein
said voltage fixing circuit portion includes a first conductive type third transistor connected between said second voltage and said second transistor and turned on by receiving a prescribed signal of said first voltage in its gate when said first shift signal is at said second voltage.

20. The display according to claim 19, wherein
said shift register circuit includes a third shift register circuit portion subsequent to said second shift register circuit portion,
the display inputting an output signal of said first voltage from said third shift register circuit portion in the gate of said third transistor when said first shift signal changes from said first voltage to said second voltage.

21. The display according to claim 19, supplying a second signal switching between said first voltage and said second voltage to the gate of said third transistor from a second signal line supplying said second signal, and
inputting said second signal of said first voltage from said second signal line in the gate of said third transistor when said first shift signal is at said second voltage.

22. The display according to claim 19, wherein
a first capacitor is connected between the gate and the source of said third transistor.

23. The display according to claim 19, wherein
said voltage fixing circuit portion includes a diode-connected first conductive type fourth transistor connected to the gate of said third transistor,
the display inputting said prescribed signal in the gate of said third transistor through said fourth transistor.

24. The display according to claim 19, wherein
said third transistor enters an OFF-state when said first shift signal and said second shift signal are at said first voltage.

25. The display according to claim 24, wherein
said voltage fixing circuit portion includes a first conductive type fifth transistor connected between said second voltage and the gate of said third transistor and turned on by receiving said output signal of said first voltage in its gate through said first transistor and said second transistor when said first shift signal and said second shift signal are at said first voltage.

26. The display according to claim 16, wherein
said first shift register circuit portion includes a sixth transistor having a drain supplied with said first voltage and a gate connected to a node outputting said first shift signal and a second capacitor connected between said gate and the source of said sixth transistor, and
said second shift register circuit portion includes a seventh transistor having a drain supplied with said first voltage and a gate connected to a node outputting said second shift signal and a third capacitor connected between said gate and the source of said seventh transistor,
the display raising or dropping the gate voltage of said sixth transistor following rise or fall of the source voltage of said sixth transistor for maintaining the gate-to-source voltage of said sixth transistor connected with said second capacitor, and
raising or dropping the gate voltage of said seventh transistor following rise or fall of the source voltage of said seventh transistor for maintaining the gate-to-source voltage of said seventh transistor connected with said third capacitor.

27. The display according to claim 26, wherein
a third signal line supplying a third signal switching between said first voltage and said second voltage is connected to said drain of said sixth transistor while a first clock signal is supplied to said gate of said sixth transistor,
said third signal line supplying said third signal is connected to said drain of said seventh transistor while a second clock signal is supplied to said gate of said seventh transistor, and
said third signal switches from said second voltage to said first voltage after said first clock signal changes from said second voltage to said first voltage and after said second clock signal changes from said second voltage to said first voltage respectively.

28. The display according to claim 26, wherein
a third signal line supplying a third signal switching between said first voltage and said second voltage is connected to said drain of said sixth transistor while a first clock signal is supplied to said gate of said sixth transistor,
a fourth signal line supplying a fourth signal switching between said first voltage and said second voltage is connected to said drain of said seventh transistor while a second clock signal is supplied to said gate of said seventh transistor,
said third signal switches from said second voltage to said first voltage after said first clock signal changes from said second voltage to said first voltage, and
said fourth signal switches from said second voltage to said first voltage after said second clock signal changes from said second voltage to said first voltage.

* * * * *